United States Patent
Sobukawa

(10) Patent No.: US 9,252,720 B2
(45) Date of Patent: Feb. 2, 2016

(54) AMPLIFIER CIRCUIT AND FEEDBACK CIRCUIT

(71) Applicant: NF CORPORATION, Yokohama, Kanagawa (JP)

(72) Inventor: Shingo Sobukawa, Yokohama (JP)

(73) Assignee: NF CORPORATION, Yokohama (JP)

( * ) Notice: Subject to any disclaimer, the term of this patent is extended or adjusted under 35 U.S.C. 154(b) by 61 days.

(21) Appl. No.: 14/162,193

(22) Filed: Jan. 23, 2014

(65) Prior Publication Data

US 2014/0132342 A1     May 15, 2014

Related U.S. Application Data

(62) Division of application No. 13/599,637, filed on Aug. 30, 2012, now Pat. No. 9,024,686.

(30) Foreign Application Priority Data

Sep. 1, 2011   (JP) .................. 2011-190462

(51) Int. Cl.
*H03F 1/34*     (2006.01)
*H03F 1/48*     (2006.01)
(Continued)

(52) U.S. Cl.
CPC .............. *H03F 1/34* (2013.01); *H03F 1/486* (2013.01); *H03F 3/087* (2013.01); *H03F 3/211* (2013.01); *H03F 3/45475* (2013.01); *H03F 2200/135* (2013.01); *H03F 2200/144* (2013.01); (Continued)

(58) Field of Classification Search
CPC ....................................... H03F 1/34

USPC ............................................. 330/85, 107, 109
See application file for complete search history.

(56) References Cited

U.S. PATENT DOCUMENTS 3,918,005 A    11/1975  Bruckenstein et al.
4,291,276 A *   9/1981  Ida ................................... 330/85
(Continued)

FOREIGN PATENT DOCUMENTS

JP    07-321569 A    12/1995
JP    10-107588 A     4/1998
(Continued)

OTHER PUBLICATIONS

"Design Considerations for a Transimpedance Amplifier", National Semiconductor Corporation, Feb. 28, 2008, retrieved from <http://www.national.com/an?AN/AN-1803.pdf>.
(Continued)

*Primary Examiner* — Steven J Mottola
(74) *Attorney, Agent, or Firm* — Westerman, Hattori, Daniels & Adrian, LLP

(57) ABSTRACT

An amplifier circuit whose frequency response has almost no soft knee characteristic or no peak when inverting input capacitance Csin varies and when feedback capacitance Cf is a fixed value of small capacitance, and a feedback circuit is provided. The amplifier circuit includes a plurality of amplifiers each of which negative feedback is provided to and which are connected in series, and a feedback means (feedback circuit) which is connected to an output side of an amplifier near output of the amplifier circuit and an input side of an amplifier near input of the amplifier circuit. These amplifiers are ones in the plurality of amplifiers. One or odd numbers of amplifiers in the plurality of amplifiers are inverting amplifiers.

6 Claims, 78 Drawing Sheets

(51) Int. Cl.
*H03F 3/45* (2006.01)
*H03F 3/08* (2006.01)
*H03F 3/21* (2006.01)

(52) U.S. Cl.
CPC ....... *H03F2200/261* (2013.01); *H03F 2200/36* (2013.01); *H03F 2200/405* (2013.01); *H03F 2200/408* (2013.01); *H03F 2200/411* (2013.01); *H03F 2203/45138* (2013.01); *H03F 2203/45512* (2013.01); *H03F 2203/45526* (2013.01); *H03F 2203/45528* (2013.01); *H03F 2203/45536* (2013.01); *H03F 2203/45544* (2013.01); *H03F 2203/45548* (2013.01); *H03F 2203/45594* (2013.01); *H03F 2203/45612* (2013.01)

(56) References Cited

U.S. PATENT DOCUMENTS

| | | | |
|---|---|---|---|
| 4,292,468 | A | 9/1981 | Yokoyama |
| 5,317,277 | A | 5/1994 | Cavigelli |
| 7,863,977 | B1 | 1/2011 | Xiang et al. |
| 2003/0058044 | A1 | 3/2003 | Candy |

FOREIGN PATENT DOCUMENTS

| | | | |
|---|---|---|---|
| JP | 11-136090 | A | 5/1999 |
| JP | 2001-68966 | A | 3/2001 |
| JP | 2001-68967 | A | 3/2001 |
| JP | 2005-064903 | A | 3/2005 |
| JP | 2005-167429 | A | 6/2005 |
| JP | 2007-315980 | A | 12/2007 |
| JP | 4184245 | B2 | 11/2008 |
| JP | 2009-005014 | A | 1/2009 |
| JP | 4451415 | B2 | 4/2010 |
| JP | 5030216 | B2 | 9/2012 |

OTHER PUBLICATIONS

FEMTO Messtechnik GmbH, "Datasheet LCA-4K-1G", Feb. 9, 2005, retrieved from <http://www.femto.de/datasheet/DE-LCA-4K-1G_5.pdf>.

Yamazaki, A et al., "An active-RC reconfigurable lowpass-polyphase tow-thomas biquad filter", IEEE International Midwest Symposium, IEEE, vol. 1, Jul. 25, 2004, XP010738961, DOI: 10.1109/MWSCAS.2004.1353896, ISBN: 978-0-7803-8346-3, pp. 1_57-1_60, Cited in Extended Extended European Search Report dated Mar. 27, 2014, issued in European Patent Application No. 12182338.9.

Piccirilli, M. C., "A fully integrated Tow-thomas biquad using current feedback amplifiers", ICECS '99., DOI: 10.1109/ICECS.1999.814413, ISBN: 978-0-7803-5682-5, 6th IEEE International Conference on Elecronics, Circuids and Systems; Sep. 5-8, 1999; PAFOS, CYPRUS, IEEE, Piscataway, NJ, USA, vol. 3, Sep. 5, 1999, XP, Cited in Extended Extended European Search Report dated Mar. 27, 2014, issued in European Patent Application No. 12182338.9.

Meng, X. R. et al., "CFA based fully integrated Tow-Thomas biquad", Electronics Letters, IEE Stevennage, GB, vol. 32, No. 8, Apr. 11, 1996, XP006005026, ISSN: 0013-5194, DOI: 10.1049/EL: 19960534, pp. 722-723, Cited in Extended Extended European Search Report dated Mar. 27, 2014, issued in European Patent Application No. 12182338.9.

U.S. Office Action dated May 13, 2014, issued in related U.S. Appl. No. 13/599,637.

U.S. Office Action dated Jan. 24, 2014, issued in related U.S. Appl. No. 13/599,637.

Extended European Search Report dated Mar. 27, 2014, issued in corresponding European Patent Application No. 12182338.9 (12 pages).

http://nsa.kpu-m.ac.jp/gijutu/kousaku/man-denki/selection_17.pdf, issue date May 2014, with partial English translation, relevant portions are cover page, pp. 3, 6 and 7 and Figures 7 and 8, (16 pages).

Extended European Search Report dated Feb. 13, 2015, issued in related European Patent Application No. 14191591.8-1805 (11 pages).

Japanese Information Offer Form dated Dec. 2, 2013, issued in corresponding Japanese Patent Application No. 2012-189400, w/English translation (2 pages).

http://www.adm.co.jp/download/mtb_16.pdf w/English translation especially Figs. 7, 8 and 10, cited in Japanese Information Offer Form dated Dec. 2, 2013 (12 pages).

http://toragi.cqpub.co.jp/Portals/0/backnumber/2012/05/p121.pdf w/English translation, cited in Japanese Information Offer Form dated Dec. 2, 2013 (2 pages).

Office Action dated Sep. 24, 2015, issued in counterpart European Application No. 14 191 591.8 (6 pages).

* cited by examiner

FIG.3C1
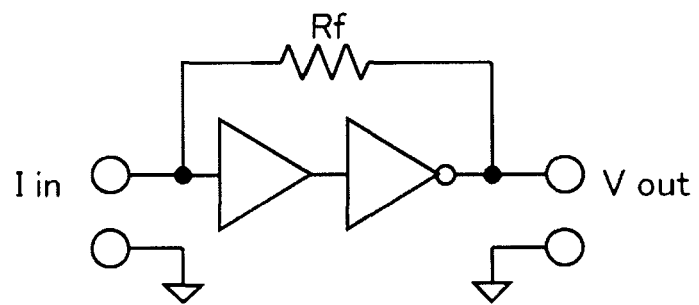

FIG.3C2
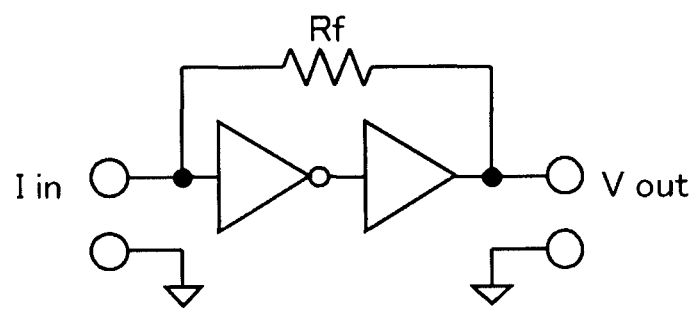

FIG.3D1
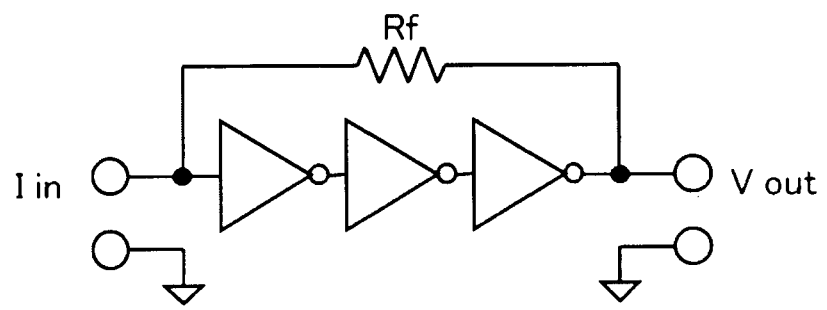

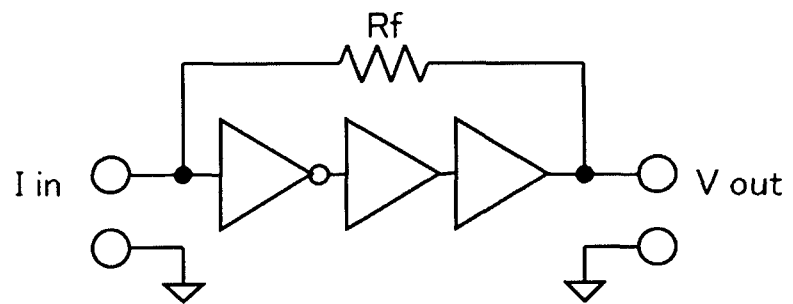
FIG.3D2

FIG.3D3
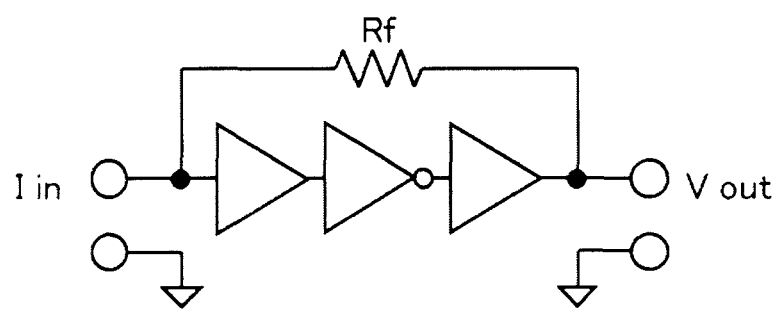

FIG.3D4
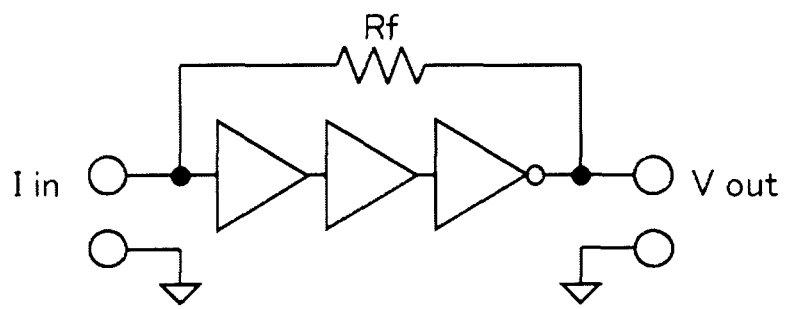

FIG.3E1
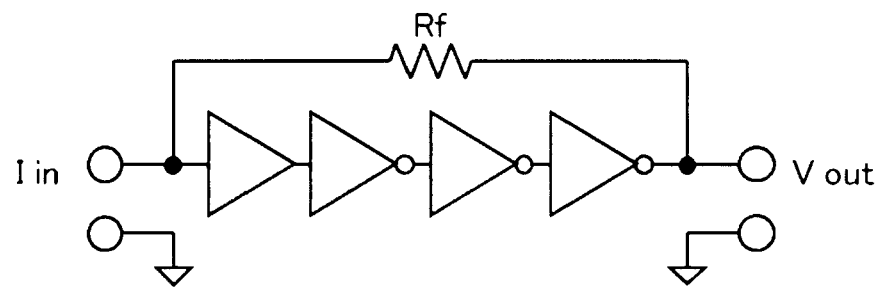

FIG.3E2
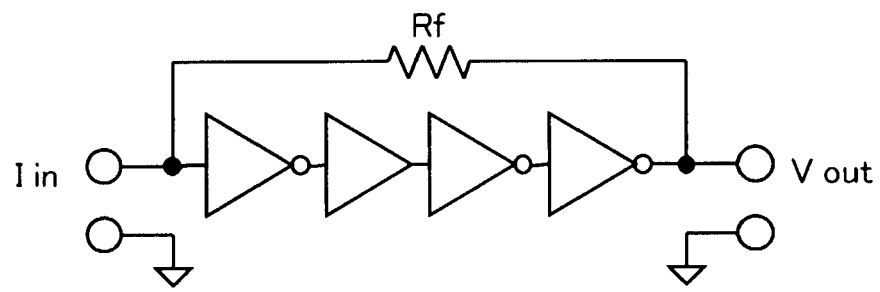

FIG.3E3
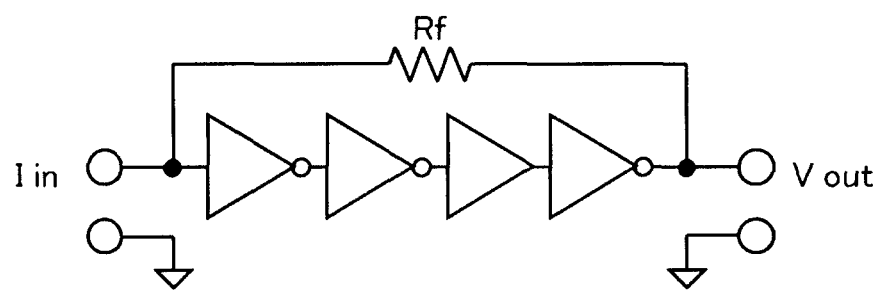

FIG.3E4
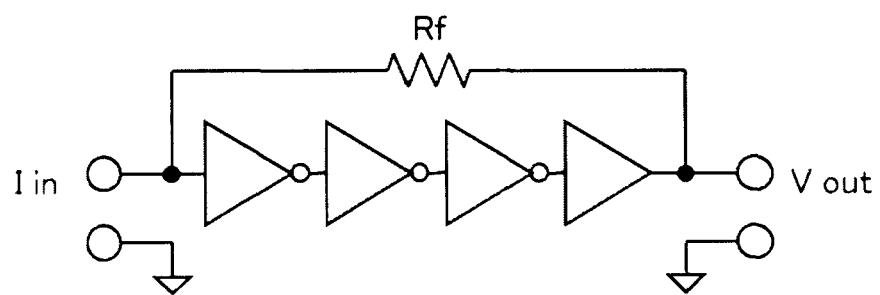

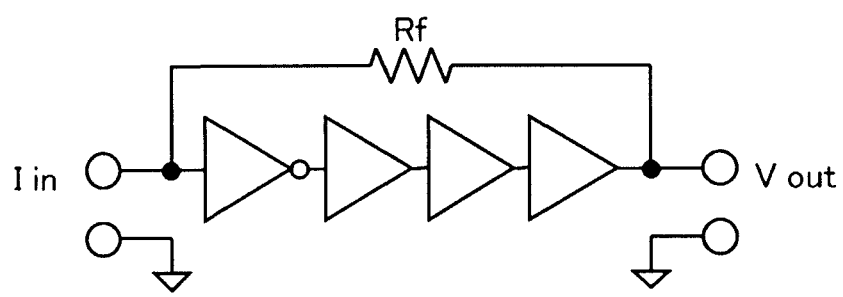
FIG.3E5

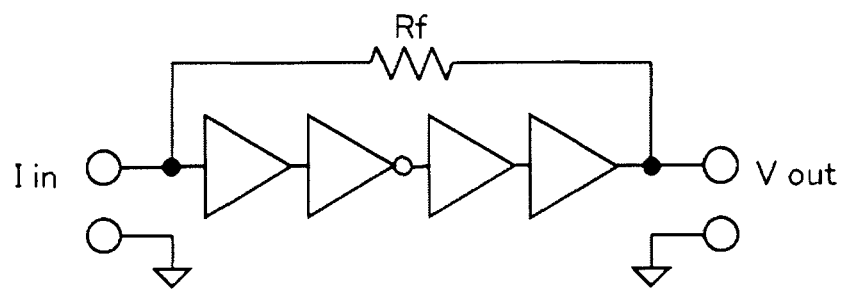
FIG.3E6

FIG.3E7
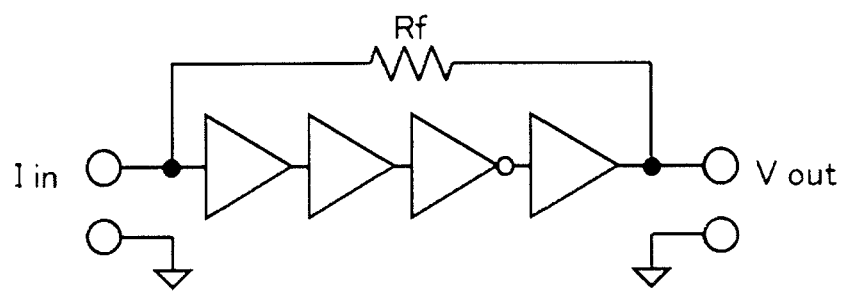

FIG.3E8
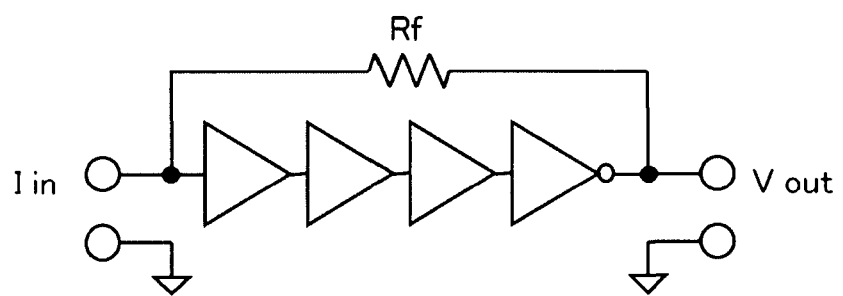

[WAVEFORM OF PULSE RESPONSE OF FIG. 13A]

VERTICAL AXIS: 1V/div, HORIZONTAL AXIS: 100 μs/div

[WAVEFORM OF PULSE RESPONSE OF FIG. 13B]

VERTICAL AXIS:1V/div、 HORIZONTAL AXIS:100μs/div

Csin ≒ 35pF

VERTICAL AXIS: 1V/div、HORIZONTAL AXIS: 200 μ s/div

Csin ≒ 125pF

VERTICAL AXIS : 1V/div、HORIZONTAL AXIS : 200 μ s/div

Csin ≒ 1025pF

VERTICAL AXIS: 1V/div、HORIZONTAL AXIS: 200 μ s/div

VERTICAL AXIS: 1V/div, HORIZONTAL AXIS: 200 μs/div

Csin ≒ 125pF

VERTICAL AXIS: 1V/div, HORIZONTAL AXIS: 200 μ s/div

Csin ≒ 125pF

VERTICAL AXIS: 1V/div, HORIZONTAL AXIS: 200 μ s/div

Csin ≒ 1025pF

VERTICAL AXIS: 1V/div, HORIZONTAL AXIS: 200 μ s/div

AMPLIFIER CIRCUIT AND FEEDBACK CIRCUIT

CROSS-REFERENCE TO RELATED APPLICATIONS

This application is a divisional of U.S. application Ser. No. 13/599,637, filed on Aug. 30, 2012, which is based upon and claims the benefit of priority of the prior Japanese Patent Application No. 2011-190462, filed on Sep. 1, 2011, the entire contents of which are incorporated herein by reference in their entirety.

TECHNICAL FIELD

The present invention relates to an amplifier circuit of a current amplifier, a voltage amplifier, a charge amplifier, a transimpedance amplifier for a photodiode, etc., and to a feedback circuit.

BACKGROUND ART

A current amplifier (current-to-voltage converter) is commonly configured using an operational amplifier (op-amp). FIG. 15 depicts a current amplifier.

In this current amplifier, the relationship between voltage output Vout, current input Iin and feedback resistance Rf in the frequency range where open loop gain of the op-amp is great is as the following formula (1).

Math. 1

$$V_{out} = -(I_{in} \times R_f) \quad (1)$$

The current amplification factor is determined by the feedback resistance Rf. For example, if the current of +1 nA flows as the current input Iin when the feedback resistance Rf is 1 GΩ, the voltage of −1 V is generated as the voltage output Vout. If the current of −1 nA flows as the current input Iin when the feedback resistance Rf is 1 GΩ, the voltage of +1 V is generated as the voltage output Vout.

In this current amplifier, if inverting input capacitance Csin, which comes from capacitance of an input cable, capacitance between input terminals of the op-amp, stray capacitance, and so on, exists in the current input (inverting input of the op-amp=virtual ground point) Iin, the bandwidth fc of flat frequency response (that is, no peak, no mid range attenuation, no soft knee characteristic, etc.), which is the widest, can be obtained under the condition that feedback capacitance Cf is the following formula (2) (Equation 3 in Design Considerations for a Transimpedance Amplifier. See Citation List below).

Math. 2

$$C_f \approx \sqrt{\frac{C_{sin}}{2\pi \cdot R_f \cdot f_t}} \quad (2)$$

The bandwidth fc in this case is as the following formula (3) (Equation 4 in Design Considerations for a Transimpedance Amplifier).

Math. 3

$$f_c \approx \sqrt{\frac{f_t}{2\pi \cdot C_{sin} \cdot R_f}} \quad (3)$$

Here, "ft" is a gain bandwidth product (unity-gain bandwidth) of the op-amp. The relationships of the above formulae are based on the premise that the open loop gain of the op-amp in the low frequency range is great enough (for example, at least 60 dB).

A common coaxial cable has the capacitance of about 100 pF per meter. If a current signal source and a current amplifier are connected via such a coaxial cable and if the connecting coaxial cable is about 10 m, the inverting input capacitance Csin is about 1,000 pF.

The art expressed in JP 2005-064903 A is used for achieving a broadband current amplifier etc. The amplifier expressed in JP 2005-064903 A uses a current feedback op-amp. Also, a buffer of high input impedance is provided before inverting input, and an integrator is provided before non-inverting input.

Datasheet LCA-4K-1G (see Citation List below) expresses the datasheet of a current amplifier, which is the high amplification factor (current amplification factor: $10^9$ V/A=1 GΩ) and low noise.

CITATION LIST

Patent Literature

JP 2005-064903 A (NF CORP) Mar. 10, 2005.

Non Patent Literature

1. Design Considerations for a Transimpedance Amplifier. Application Note 1803 [online]. National Semiconductor Corporation, Feb. 28, 2008. Retrieved from the Internet: <URL: http://www.national.com/an/AN/AN-1803.pdf>.
2. Datasheet LCA-4K-1G [online]. FEMTO Messtechnik GmbH, Feb. 9, 2005. Retrieved from the Internet: <URL: http://www.femto.de/datasheet/DE-LCA-4K-1G_5.pdf>.

SUMMARY OF INVENTION

Technical Problem

An amplifier has the following problems.

(1) The Inverting Input Capacitance Csin Affects the Performance of the Amplifier.

(1-1) Flat Frequency Response Cannot be Obtained.

Flat frequency response cannot be obtained in the current amplifier depicted in FIG. 15 if the feedback capacitance Cf is fixed and the inverting input capacitance Csin is varied by, for example, the length of an input signal cable. FIGS. 16A to 16D and 17A to 17D depict this situation. FIG. 16A depicts it that the peak is generated in the frequency response when the inverting input capacitance Csin is large under the condition that the feedback capacitance Cf is set so as to adapt the small inverting input capacitance Csin. FIG. 17A depicts the situation that the knee characteristic of the frequency response softens when the inverting input capacitance Csin is small under the condition that the feedback capacitance Cf is set so as to adapt the large inverting input capacitance Csin. FIGS. 16B to 16D depict it that an overshoot is introduced into the waveform of pulse response when the inverting input capacitance Csin is large under the condition that the feedback capacitance Cf is set so as to adapt the small inverting input capacitance Csin. Conversely, FIGS. 17B to 17D depict the situation that the rise of the waveform of pulse response is blunted when the inverting input capacitance Csin is small under the condition that the feedback capacitance Cf is set so as to adapt the large inverting input capacitance Csin.

The circuit configuration used as a transimpedance amplifier for a photodiode has the same problem as expressed in Design Considerations for a Transimpedance Amplifier. A charge amplifier commonly used for integrating current to measure charge also has the same problem as the above described current amplifier.

Such a problem occurs as well in a voltage amplifier when the inverting input capacitance Csin is large. For example, a circuit that inverts and sums a lot of input signals may have the same problem because stray capacitance is large due to a long wiring for a virtual ground point as depicted in FIG. 19.

(1-2) The Bandwidth fc Narrows.

In the current amplifier depicted in FIG. 15, there is the inconvenience of narrowing the bandwidth fc as the inverting input capacitance Csin is becoming large, even if the feedback capacitance Cf is adjusted whenever another inverting input capacitance Csin is set (see the above described formula (3), and Equation 4 in Design Considerations for a Transimpedance Amplifier. The bandwidth fc is inversely proportional to the square root of the inverting input capacitance Csin). FIGS. 18A to 18D depict this situation.

(2) Terminal capacitance $Cs_{Rf}$ of the feedback resistance Rf Affects the bandwidth fc to narrow.

The terminal capacitance $Cs_{Rf}$ exists between the terminals of the feedback resistance Rf because of stray capacitance as depicted in FIG. 20 even if the inverting input capacitance Csin is small enough not to need the feedback capacitance Cf. In this case, the bandwidth fc is as the following formula (4).

Math. 4

$$fc \approx \frac{1}{2\pi \cdot Cs_{Rf} \cdot Rf} \quad (4)$$

Therefore, the bandwidth fc extremely narrows especially when the feedback resistance Rf is large. For example, if the feedback resistance Rf is 1 GΩ, the bandwidth fc deteriorates so as to be nearly equal to 1.59 kHz even if the terminal capacitance $Cs_{Rf}$ of the feedback resistance Rf is a small value, for example, 0.1 pF. The terminal capacitance $Cs_{Rf}$ of a general tip resistance is about 0.1 pF.

Input capacitance of an amplifier element, wiring capacitance, etc. exist in an amplifier for its configuration, and the inverting input capacitance Csin cannot be zero. Thus, the bandwidth fc narrows due to factors of the above described (1-2) and (2). In the above (1-2), influence of the feedback resistance Rf is relatively minor since the bandwidth fc is inversely proportional to the square root of the feedback resistance Rf. In the above (2), the influence of the deterioration of the bandwidth fc caused by the large feedback resistance Rf is relatively great since the bandwidth fc is inversely proportional to the feedback resistance Rf.

(3) A Current Feedback Op-Amp Cannot be Used.

A current feedback op-amp cannot be used in the current amplifier depicted in FIG. 15 because of the following reasons (a) to (c).

(a) The feedback resistance Rf of a recommended value (for example, hundreds of ohms to a few kiloohms) is used for the current feedback op-amp. On the other hand, the feedback resistance Rf of tens of kiloohms to a few gigaohms (current amplification factor: tens of thousands to billions) is generally used for a current amplifier. Thus, a current feedback op-amp cannot deliver the performance, especially high-speed performance (see FIG. 21E. For reference, a transimpedance amplifier for a photodiode uses about 1 GΩ of Rf, and a charge amplifier uses about 1 MΩ of Rf, for example).

(b) The feedback capacitance Cf might make the operation of a current feedback op-amp unstable. The feedback capacitance Cf is selected according to the inverting input capacitance Csin. The operation is unstable when the feedback capacitance Cf is a certain value or over (for example, about more than 10 pF) in a current feedback op-amp. And, a current feedback op-amp has the characteristic of oscillating with the large feedback capacitance Cf.

(c) The inverting input of a current feedback op-amp has high input bias current and high input noise current, and low input impedance. This fact will be major error cause especially when a current amplifier of the high current amplification factor is configured.

(4) The Large Feedback Resistance Rf Cannot be Used.

An integrator is connected to the inverting input of an op-amp in JP 2005-064903 A. The value of the input resistance of the integrator is just the same as that of integral resistance connected to the input thereof. The current amplification factor of a current amplifier is determined by the feedback resistance Rf. There is a problem of decreasing the current amplification factor because input current is shunted to the input resistance of the integrator when the integrator is connected. Therefore, it is necessary for the value of the integral resistance of the integrator to be large enough for the feedback resistance Rf.

When the current amplification factor is high, that is, the feedback resistance Rf is large, resistance that exceeds the value of the feedback resistance Rf is needed as the integral resistance of the integrator. However, when 100 GΩ is assumed as the integral resistance value larger than the value of the feedback resistance Rf of 1 GΩ, such a resistance value is over the value of insulation resistance of a common printed circuit board. This is not realistic.

Therefore, it is necessary for the value of the integral resistance of the integrator to be large enough for the value of the feedback resistance Rf in the amplifier etc. expressed in JP 2005-064903 A. Thus, there is a problem that the value of the feedback resistance Rf has necessarily a limit.

An object of the present invention is to provide an amplifier circuit and a feedback circuit that can solve at least one of the above problems (1) to (4).

Solution to Problem

According to aspects of the present invention, an amplifier circuit and a feedback circuit are as follows.

(1) The amplifier circuit comprising a plurality of amplifiers each of which negative feedback is provided to and which are connected in series, and a feedback means which is connected to an output side of an amplifier near output of the amplifier circuit and an input side of an amplifier near input of the amplifier circuit, the amplifiers being ones in the plurality of amplifiers, wherein one or odd numbers of amplifiers in the plurality of amplifiers are inverting amplifiers.

(2) The amplifier circuit of (1), wherein the plurality of amplifiers are configured by two amplifiers, which are the amplifier near input that is a non-inverting amplifier and the amplifier near output that is an inverting amplifier.

(3) The amplifier circuit of (1), wherein the amplifier near input is a follower circuit using an amplifier element or an amplifier using an amplifier element.

(4) The amplifier circuit of (3), wherein input voltage of the amplifier near input is inverted and summed via a buffer amplifier and an integrator, and potential deference between input and output of the amplifier element is compensated.

(5) The amplifier circuit of (3), further comprising another circuit which is the same circuit configuration to the amplifier near input, and whose input potential is fixed, wherein potential difference between input and output of the amplifier element in the amplifier near input is compensated by subtracting output of an amplifier element in said another circuit, from output of the amplifier element in the amplifier near input, or by subtracting the output of the amplifier element in the amplifier near input, from the output of the amplifier element in said another circuit.

(6) The amplifier circuit of (1), further comprising an output buffer at the output side of the amplifier near output.

(7) The feedback circuit that is used along with an amplifier, the feedback circuit comprising a first resistance, a first capacitor, a buffer amplifier, and a parallel circuit of a second resistance and a second capacitor, wherein one end of the first resistance is connected to an output side of the amplifier, one end of the first capacitor and an input side of the buffer amplifier are connected to another end of the first resistance, another end of the first capacitor is grounded alternately, one end of the parallel circuit is connected to an output side of the buffer amplifier, and another end of the parallel circuit is connected to an input side of the amplifier, so that a product of a resistance value of the first resistance and a capacitance value of the first capacitor is equivalent to a product of a resistance value of the second resistance and a capacitance value of the second capacitor.

(8) The feedback circuit that is used along with an amplifier, the feedback circuit comprising a first resistance, a first capacitor, and a parallel circuit of a second resistance and a second capacitor, wherein one end of the first resistance is connected to an output side of the amplifier, one end of the first capacitor and one end of the parallel circuit are connected to another end of the first resistance, another end of the first capacitor is grounded alternately, and another end of the parallel circuit is connected to an input side of the amplifier, so that a product of a resistance value of the first resistance and a capacitance value of the first capacitor is equivalent to a product of a resistance value of the second resistance and a capacitance value of the second capacitor.

(9) The feedback circuit that is used along with an amplifier, the feedback circuit comprising an attenuator, a buffer amplifier, and a capacitor, wherein an input side of the attenuator is connected to an output side of the amplifier, an input side of the buffer amplifier is connected to an output side of the attenuator, one end of the capacitor is connected to an output side of the buffer amplifier, and another end of the capacitor is connected to an input side of the amplifier, and the feedback circuit works equivalently as a capacitative element that has the same capacitance value to a product value of capacitance of the capacitor and an attenuation factor of the attenuator.

(10) The feedback circuit that is used along with an amplifier, the feedback circuit comprising an attenuator which includes a first resistance and a second resistance, and a capacitor, wherein an input side of the attenuator is connected to an output side of the amplifier, one end of the capacitor is connected to an output side of the attenuator, and another end of the capacitor is connected to an input side of the amplifier, and the feedback circuit works equivalently as a capacitative element that has the same capacitance value to a product value of capacitance of the capacitor and an attenuation factor of the attenuator when impedance of the capacitor is larger than a value of parallel resistance, which is formed by the first resistance and the second resistance, in desired frequency.

(11) The amplifier circuit comprising an amplifier, and one of a first, second third and fourth feedback circuit, or both of the first or second feedback circuit and the third or fourth feedback circuit, wherein the first feedback circuit includes a first resistance, a first capacitor, a buffer amplifier, and a parallel circuit of a second resistance and a second capacitor, wherein one end of the first resistance is connected to an output side of the amplifier, one end of the first capacitor and an input side of the buffer amplifier are connected to another end of the first resistance, another end of the first capacitor is grounded alternately, one end of the parallel circuit is connected to an output side of the buffer amplifier, and another end of the parallel circuit is connected to an input side of the amplifier, so that a product of a resistance value of the first resistance and a capacitance value of the first capacitor is equivalent to a product of a resistance value of the second resistance and a capacitance value of the second capacitor, the second feedback circuit includes the first resistance, the first capacitor, and the parallel circuit of the second resistance and the second capacitor, wherein one end of the first resistance is connected to the output side of the amplifier, one end of the first capacitor and one end of the parallel circuit are connected to another end of the first resistance, another end of the first capacitor is grounded alternately, and another end of the parallel circuit is connected to the input side of the amplifier, so that the product of the resistance value of the first resistance and the capacitance value of the first capacitor is equivalent to the product of the resistance value of the second resistance and the capacitance value of the second capacitor, the third feedback circuit includes an attenuator, a buffer amplifier, and a capacitor, wherein an input side of the attenuator is connected to the output side of the amplifier, an input side of the buffer amplifier is connected to an output side of the attenuator, one end of the capacitor is connected to an output side of the buffer amplifier, and another end of the capacitor is connected to the input side of the amplifier, and the feedback circuit works equivalently as a capacitative element that has the same capacitance value to a product value of capacitance of the capacitor and an attenuation factor of the attenuator, and the fourth feedback circuit includes an attenuator which includes a third resistance and a fourth resistance, and the capacitor, wherein an input side of the attenuator is connected to the output side of the amplifier, one end of the capacitor is connected to an output side of the attenuator, and another end of the capacitor is connected to the input side of the amplifier, and the feedback circuit works equivalently as a capacitative element that has the same capacitance value to a product value of capacitance of the capacitor and an attenuation factor of the attenuator when impedance of the capacitor is larger than a value of parallel resistance, which is formed by the third resistance and the fourth resistance, in desired frequency.

(12) The amplifier circuit of (1), wherein the amplifier circuit configures a current amplifier, a voltage amplifier, a charge amplifier, and a transimpedance amplifier for a photodiode.

(13) The amplifier circuit of (11), wherein the amplifier circuit configures a current amplifier, a voltage amplifier, a charge amplifier, and a transimpedance amplifier for a photodiode.

Advantageous Effects of Invention

According to the amplifier circuit or the feedback circuit of the aspects of the present invention, any of the following effects can be obtained.

(1) The inverting input capacitance Csin does not affect the performance of the amplifier.

(1-1) Frequency response has almost no soft knee characteristic or no peak when the inverting input capacitance Csin varies and when the feedback capacitance Cf is a fixed value of small capacitance. That is, the change in the flatness of the frequency response according to variation of the inverting input capacitance Csin is small and the optimum frequency response can be kept.

(1-2) The feedback capacitance Cf for compensating the inverting input capacitance Csin can be small or omitted, and the deterioration of the bandwidth fc can be suppressed even if the inverting input capacitance Csin increases. Thereby, the bandwidth fc that is wide can be realized. This effect is outstanding especially when the inverting input capacitance Csin is small.

(2) According to the feedback circuit of one aspect of the present invention, the deterioration of the bandwidth fc caused by the influence of the terminal capacitance $Cs_{Rf}$ of the feedback resistance Rf can be prevented, and thus, the bandwidth fc which is wide can be realized. This effect is outstanding especially when the feedback resistance Rf is large. Also, according to a feedback circuit of another aspect of the present invention, capacitance that is much smaller than the terminal capacitance $Cs_{Rf}$ can be connected to the feedback resistance Rf in parallel. Thus, frequency response and the waveform of pulse response can be more optimized. Small capacitance that is difficult to be realized by the conventional art can also be realized, and capacitance is continuously variable.

(3) A current feedback op-amp can be used for part of an amplifier circuit, and the characteristic of a broadband which a current feedback op-amp has can be exploited.

(4) There is no limit for the magnitude of the feedback resistance Rf.

Additional objects and advantages of the present invention will be apparent from the following Description of Embodiments thereof, which are best understood with reference to the accompanying drawings.

BRIEF DESCRIPTION OF DRAWINGS

FIGS. 5A to 5I depict amplifier circuits according to a third embodiment;

FIG. 8 depicts typical response of an amplifier circuit according to the fourth embodiment;

DESCRIPTION OF EMBODIMENTS

First Embodiment

A first embodiment describes a broadband amplifier circuit where the change in the frequency response due to inverting input capacitance Csin is a little.

Figure 1A:
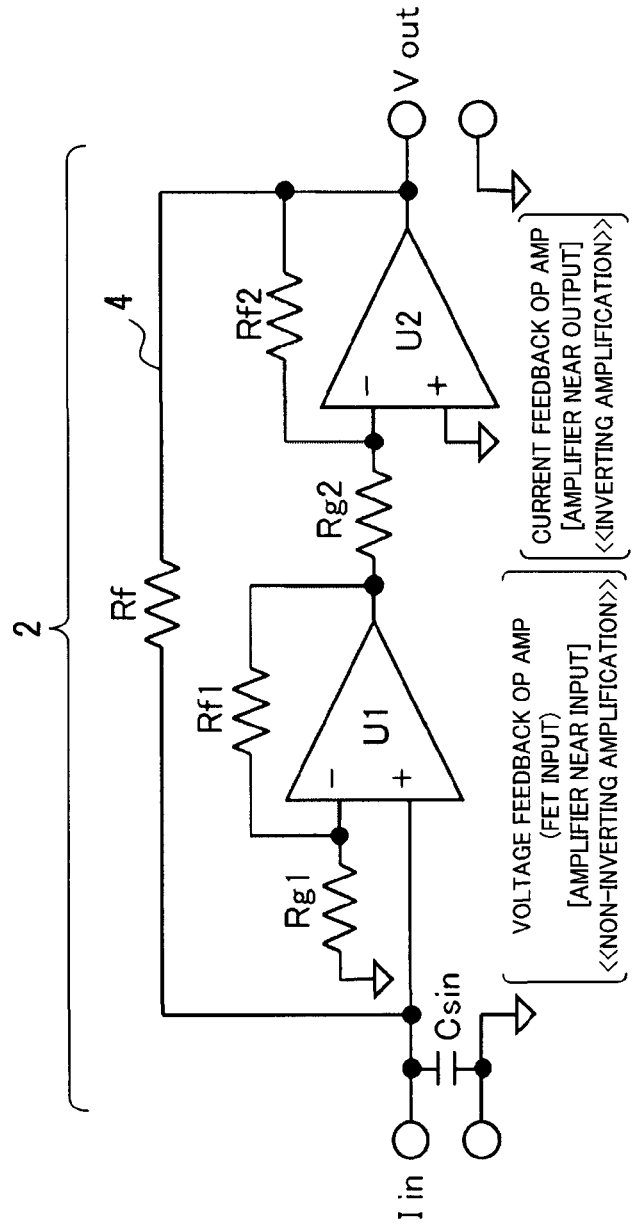
FIGS. 1A and 1B depict amplifier circuits according to a first embodiment.
Figure 1B:
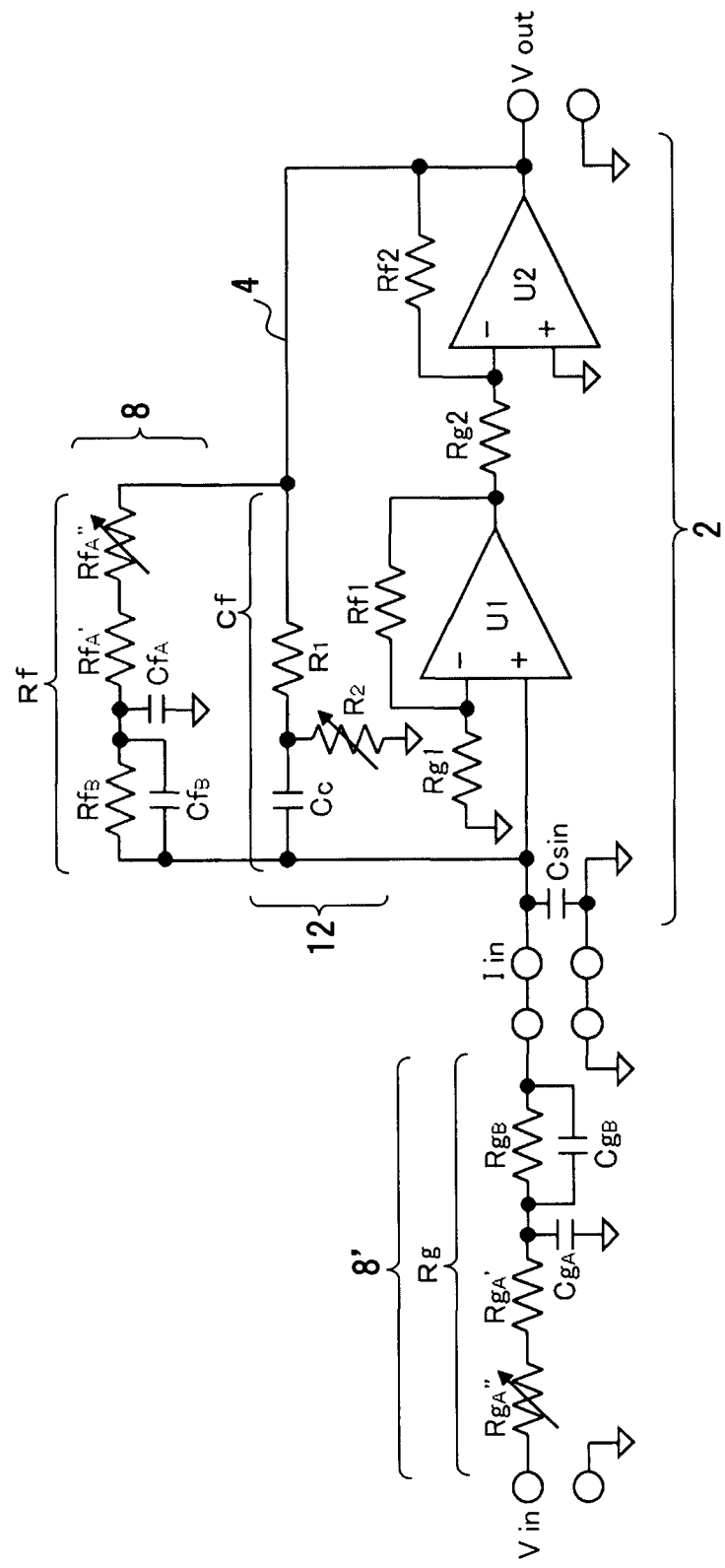

FIGS. 1A and 1B depict amplifier circuits according to the first embodiment. FIG. 1A depicts a current amplifier illustrating the principle of the amplifier circuit. In FIG. 1B, a voltage amplifier is configured for measuring frequency response and pulse response.

A current amplifier 2 depicted in FIG. 1A is an example of the amplifier circuit of this embodiment, and provides first and second amplifiers as an example of a plurality of amplifiers. As the first amplifier, a non-inverting amplifier U1 near the input, to which negative feedback is individually provided, is provided. As the second amplifier, an inverting amplifier U2 near the output, to which negative feedback is individually provided, is provided. These amplifiers are connected in series. A feedback circuit 4 that is an example of feedback means is also provided. Feedback resistance Rf in this feedback circuit 4 provides negative feedback from an output of the amplifier U2 near the output to an input of the amplifier U1 near the input. Rf1 is feedback resistance that provides negative feedback to the amplifier U1 individually, Rf2 is feedback resistance that provides negative feedback to the amplifier U2 individually, and Rf is feedback resistance of the feedback circuit 4.

When the feedback resistance Rf of the large value is used to increase the current amplification factor of the current amplifier 2, it is preferable that a FET (Field Effect Transistor) input op-amp is used for the amplifier U1 near the input to make input impedance high.

For obtaining good frequency response, it is preferable that the bandwidth of the amplifier U1 and the bandwidth of the amplifier U2, which is connected with the amplifier U1 in series, has a rate (staggered rate) of a certain level (for example, about 10 times) or over. It is described here as an example that wider bandwidth than the amplifier U1 near the input is realized by using a current feedback op-amp for the amplifier U2 near the output. There are various measures to obtain good frequency response other than a staggered rate.

It is also described here as an example that the gain of the amplifier U1 near the input in the low frequency range is 40 dB, the gain of the amplifier U2 near the output in the low frequency range is 60 dB, and then the gain of the whole current amplifier 2, which is configured by the amplifiers connected in series, in the low frequency range is 100 dB. This example is of course not for limiting this embodiment.

A commercial op-amp IC (integrated circuit) is typical of an op-amp. An op-amp may be a hybrid IC. An op-amp may be combination of amplifiers configured by discrete amplifier elements etc. An op-amp may be also a combination circuit of a discrete amplifier element and a commercial op-amp IC etc. An op-amp may be an amplifier that can limit the gain using the feedback resistance Rf and the gain resistance Rg to achieve a broadband.

Figure 2A:
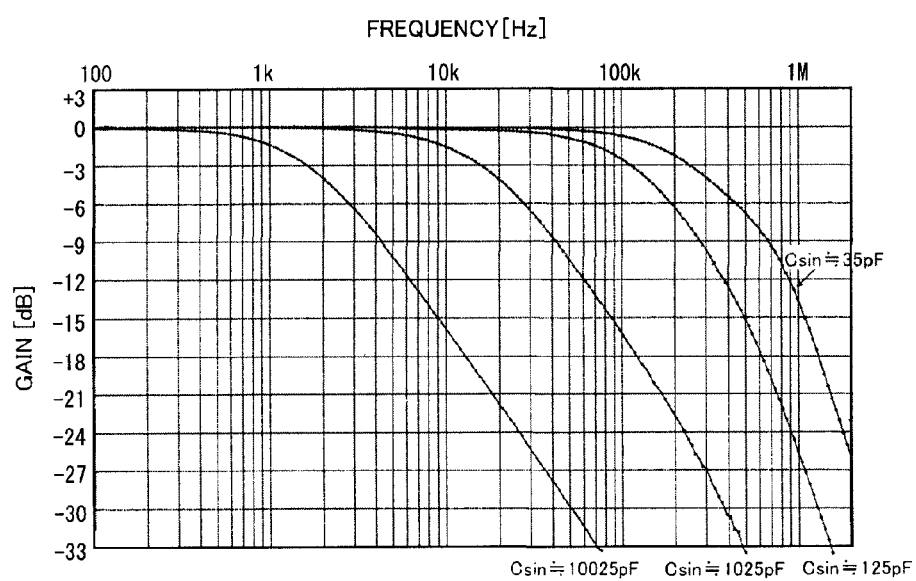
FIGS. 2A to 2D depict examples of frequency response and waveforms of pulse response, and influence of inverting input capacitance Csin when feedback resistance Rf is 1 GΩ in FIG. 1B.
Figure 2B:
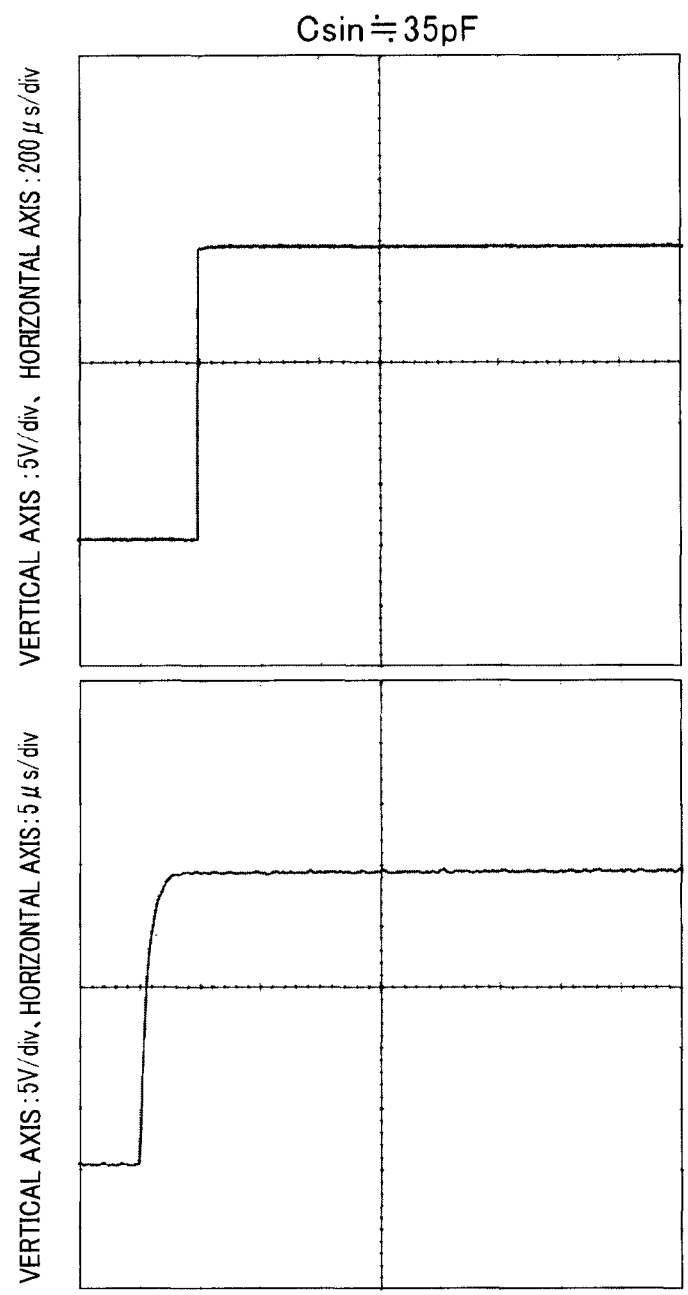
Figure 2C:
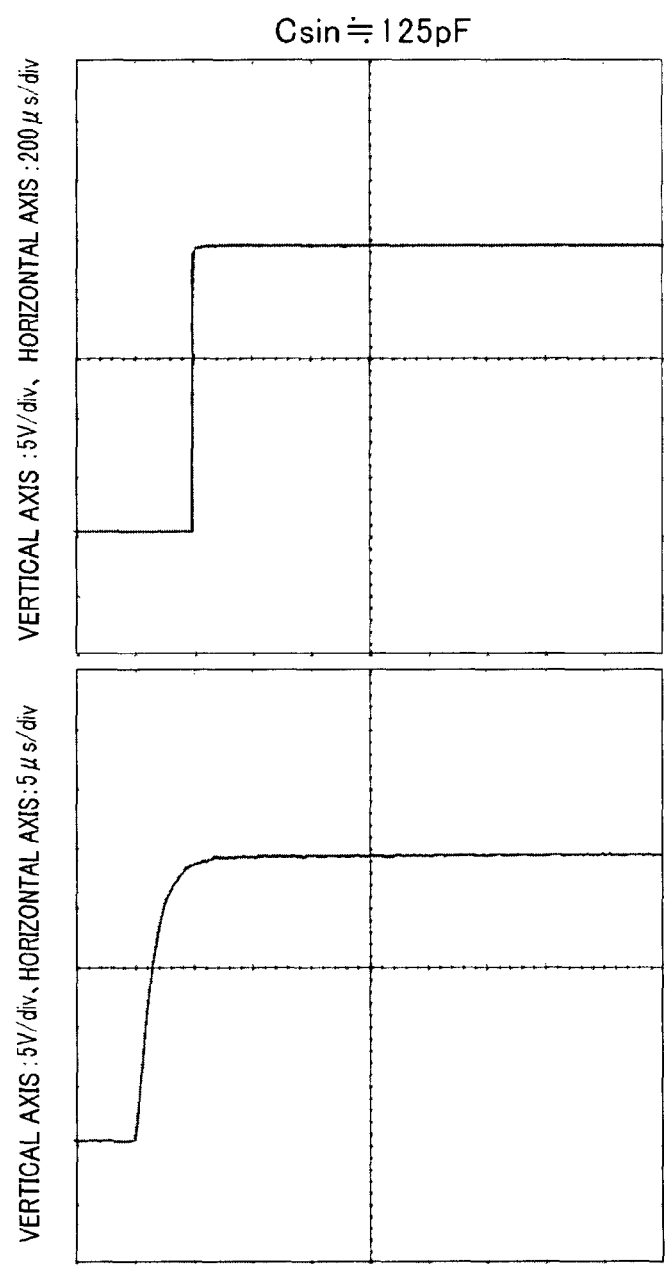
Figure 2D:
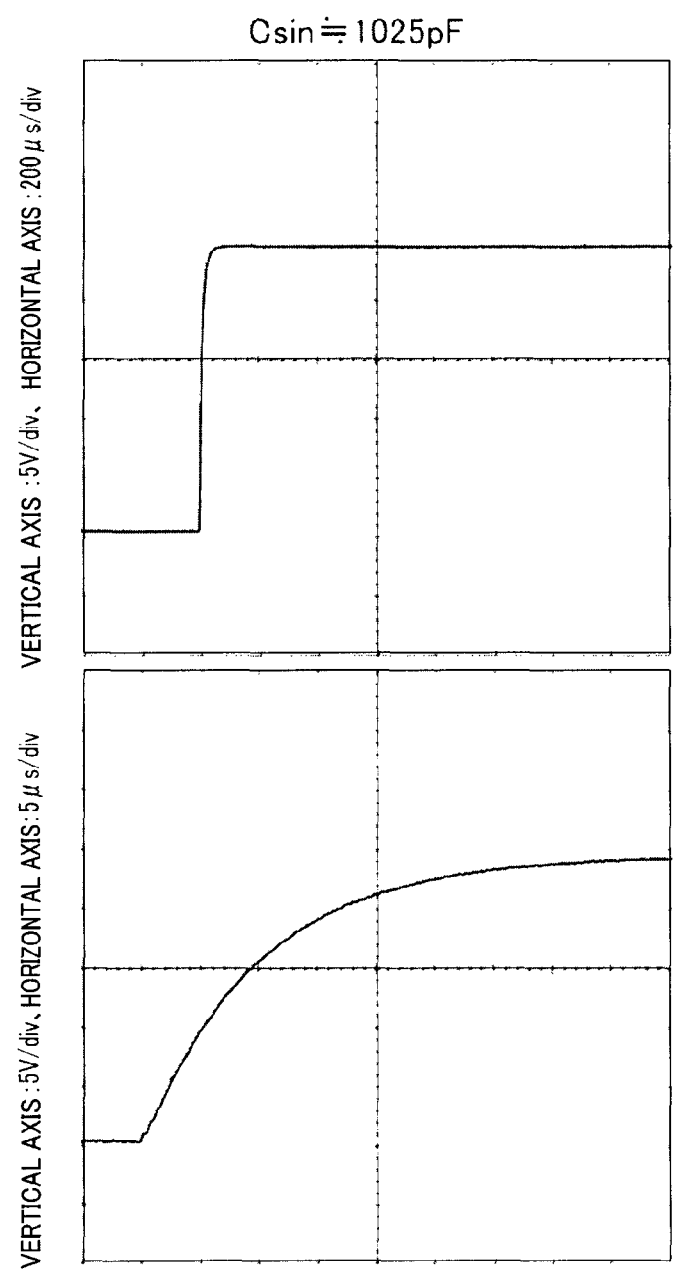

FIG. 1B is a response measuring circuit of configuring a voltage amplifier. FIG. 2A depicts the frequency response of this response measuring circuit. FIGS. 2B to 2D depict the waveforms of pulse response of this response measuring circuit (for comparison with FIGS. 16B to 16D, 17B to 17D and 18B to 18D, each FIGS. 2B to 2D depicts two waveforms of pulse response. One is when the horizontal axis is 200 μs/div, which is the same as that of FIGS. 16B to 16D, 17B to 17D and 18B to 18, and another is when the horizontal axis is 5 μs/div, which is easy to find the difference in the rise time). In this measuring circuit, the voltage amplifier is configured with the gain resistance Rg added to the input of the current amplifier 2. This gain resistance Rg is configured by a circuit whose resistance is 1 GΩ, and whose terminal capacitance is equivalently zero due to a circuit 8'. This circuit 8' is the same or similar to a circuit of a feedback circuit 8 of the sixth embodiment, described below. The feedback resistance Rf whose resistance is 1 GΩ, and whose terminal capacitance is equivalently zero due to the feedback circuit 8 of the sixth embodiment is used as described below, and a feedback circuit 12 of the seventh embodiment as described below realizes the small feedback capacitance Cf that is for optimizing the waveforms of pulse response.

Measurement is performed when the inverting input capacitance Csin (including the input capacitance of the amplifier U1 and the stray capacitance of wiring) is about 35 pF, 125 pF, 1,025 pF and 10,025 pF while the value of the small feedback capacitance Cf that is for optimizing the waveforms of pulse response is fixed. It is found from FIG. 2A that the change in the frequency response is a little even for the varied inverting input capacitance Csin, and that the bandwidth fc is inversely proportional to the inverting input capacitance Csin. It is found from FIGS. 2B to 2D that there is of course change in the rise time according to the bandwidth fc but the waveforms of good pulse response without overshoot or the like are obtained.

If the frequency response according to the first embodiment (FIG. 2A) is compared with the optimum frequency response (FIG. 18A), which is obtained by the amplifier (FIG. 15) from the feedback capacitance Cf adjusted for each varying inverting input capacitance Csin, the bandwidth fc when the inverting input capacitance Csin is about 35 pF is about 40 times as much as the optimum frequency response. The bandwidth fc when the inverting input capacitance Csin is about 1,025 pF is at least 10 times as much as the optimum frequency response.

The change in the frequency response according to the inverting input capacitance Csin in the related art and the reason why the change occurs will be described before it is described why the change in the frequency response according to the inverting input capacitance Csin is a little in the amplifier of the first embodiment and why a broadband can be achieved by the amplifier of the first embodiment.

Figure 15:
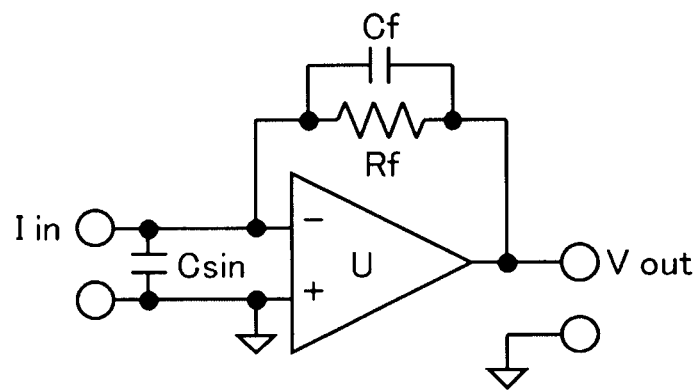
FIG. 15 depicts current amplifiers of the related art.
Figure 21A:
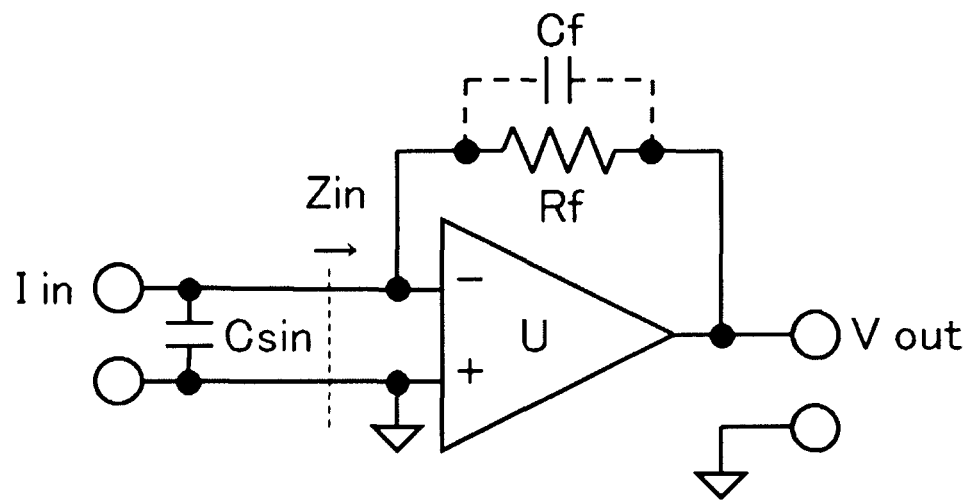
FIGS. 21A to 21F depict problems of the current amplifier of the related art, the relationship between bandwidth and gain, and an example of open loop gain.

FIG. 21A depicts the same configuration as FIG. 15. FIG. 21C depicts an example of the frequency response of the open loop gain of an op-amp U in FIG. 21A. In the low frequency range, gain is almost fixed at Av, and the input impedance Zin of the current amplifier is also fixed based on a formula (6) as described below. Therefore, the input impedance Zin is fixed in the low frequency range independently from frequency, and works like resistance. On the other hand, the open loop gain of the op-amp U decreases by slope of −6 dB/oct (−20 dB/dec precisely, which also applies hereafter) according to the increase of the frequency in the range over a certain frequency. In this frequency range, the input impedance Zin increases according to the decrease of the gain based on the formula (6) described below. Therefore, the input impedance Zin increases proportionally to the frequency in the range over a certain frequency, and thus works like inductance.

Figure 21B:
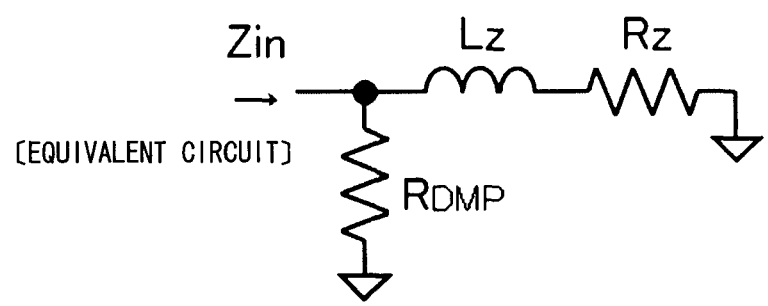
Figure 21C:
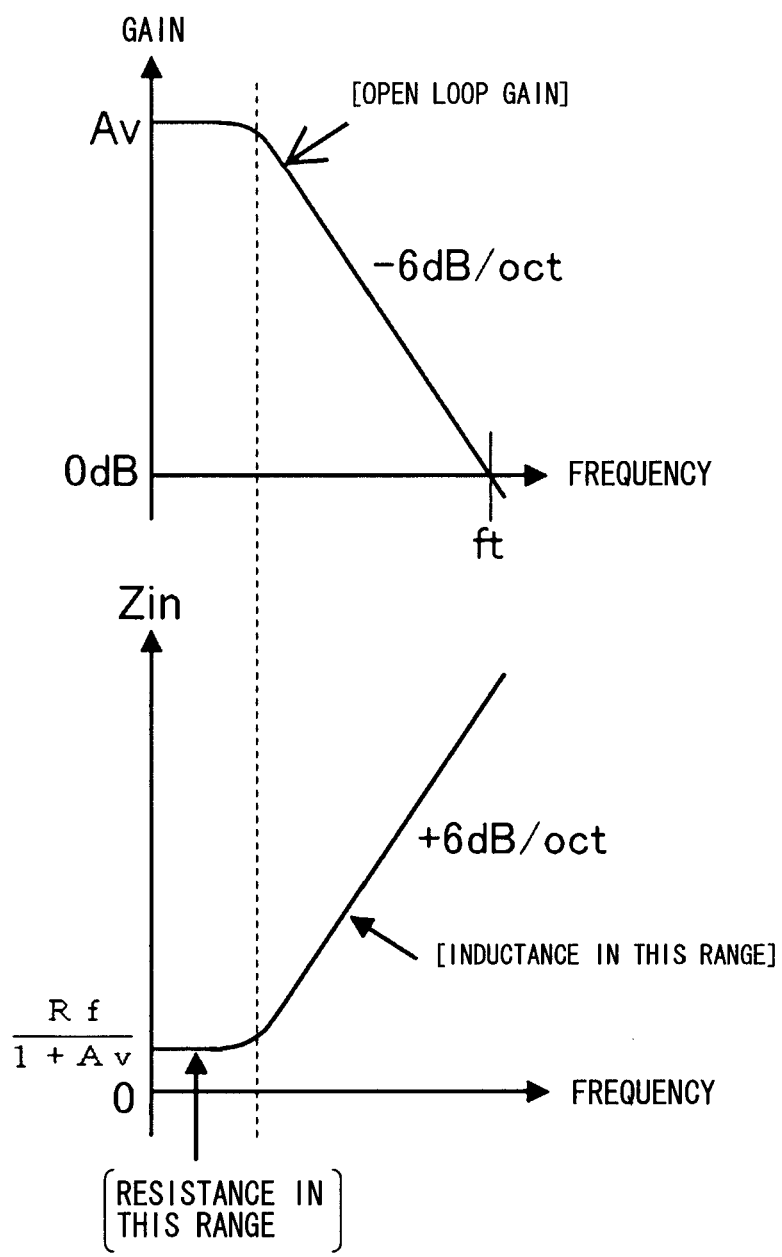

If the input impedance Zin of the current amplifier is seen from a dotted line in FIG. 21A, it works like an equivalent circuit of FIG. 21B. Constants in this equivalent circuit are as the following formulae (5) to (7). "ft" is the gain bandwidth product of the op-amp U.

Math. 5
$$Lz = \frac{Rf}{2\pi \cdot ft} \quad (5)$$

Math. 6
$$Rz = \frac{Rf}{1 + Av} \quad (6)$$

Math. 7
$$R_{DMP} = \frac{1}{2\pi \cdot ft \cdot Cf} \quad (7)$$

As the above, the input impedance Zin works like resistance in the low frequency range because the resistance Rz is dominant, and works like inductance in the range over a certain frequency because the inductance Lz is dominant. When there exists the inverting input capacitance Csin, a parallel resonant circuit is configured along with the inductance Lz. This resonant circuit generates the peak in the frequency response at the resonant frequency.

When there also exists the feedback capacitance Cf, resonance is suppressed (damped) by equivalent damping resistance $R_{DMP}$ as the formula (7). If the capacitance of the formula (2) is selected for the feedback capacitance Cf, flat frequency response (no peak, no mid range attenuation, or the like) and the bandwidth fc, which is widest, are obtained. In short, critical damping is realized.

Figure 16A:
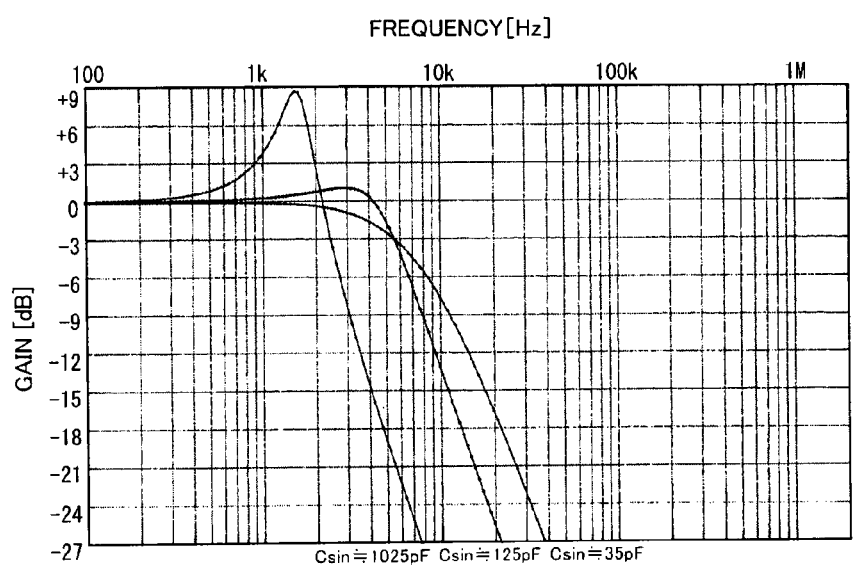
FIGS. 16A to 16D depict influence of the inverting input capacitance Csin in the current amplifier of the related art.
Figure 16B:
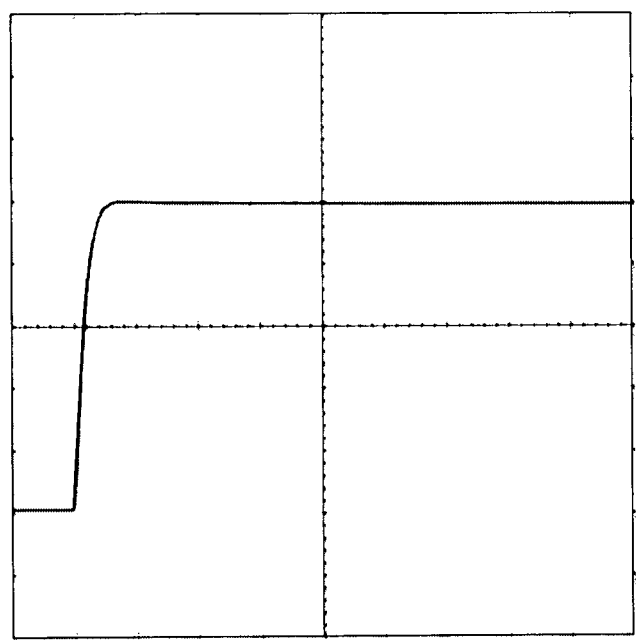
Figure 16C:
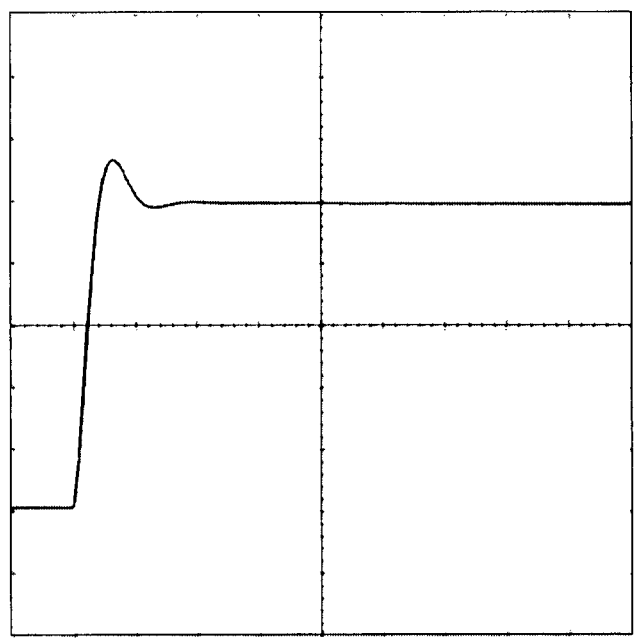
Figure 16D:
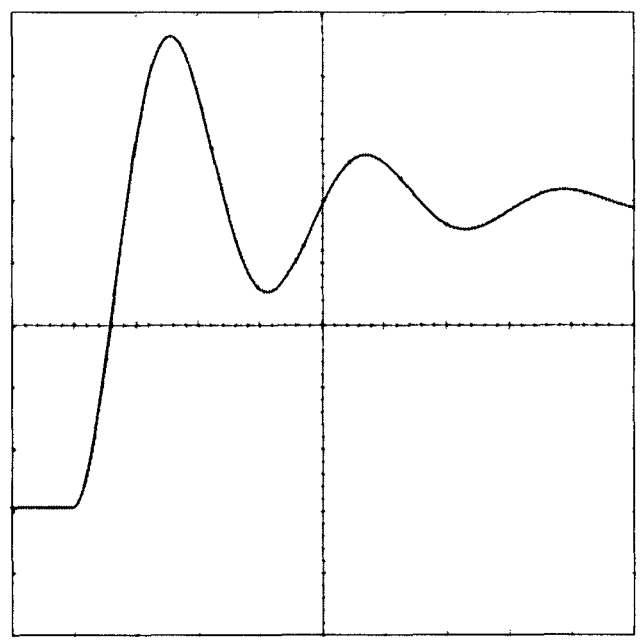
Figure 17A:
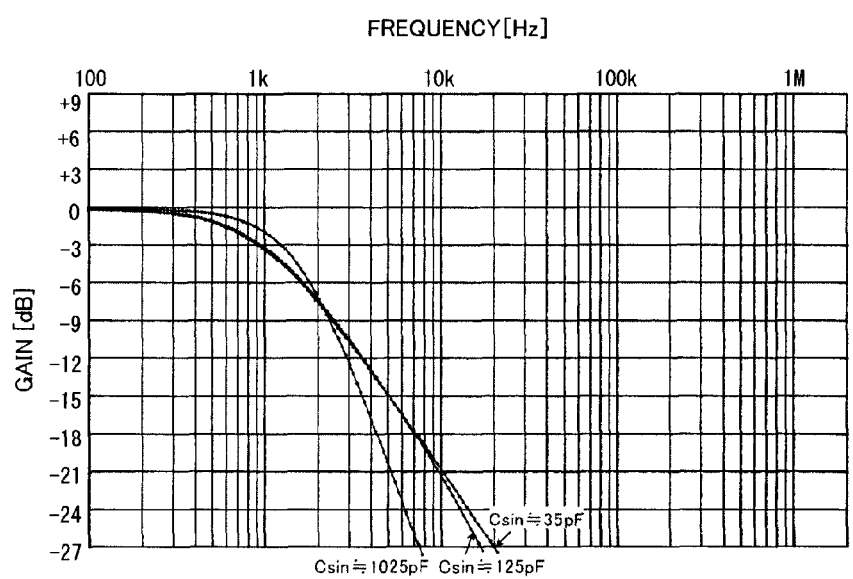
FIGS. 17A to 17D depict influence of the inverting input capacitance Csin in the current amplifier of the related art.
Figure 17B:
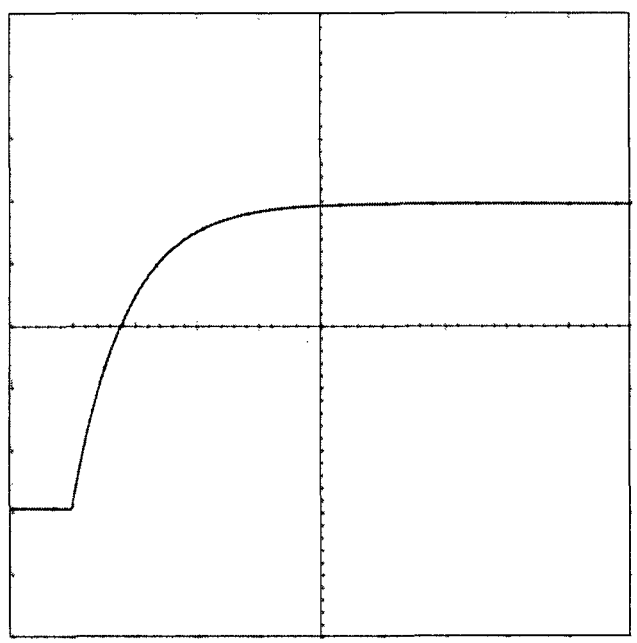
Figure 17C:
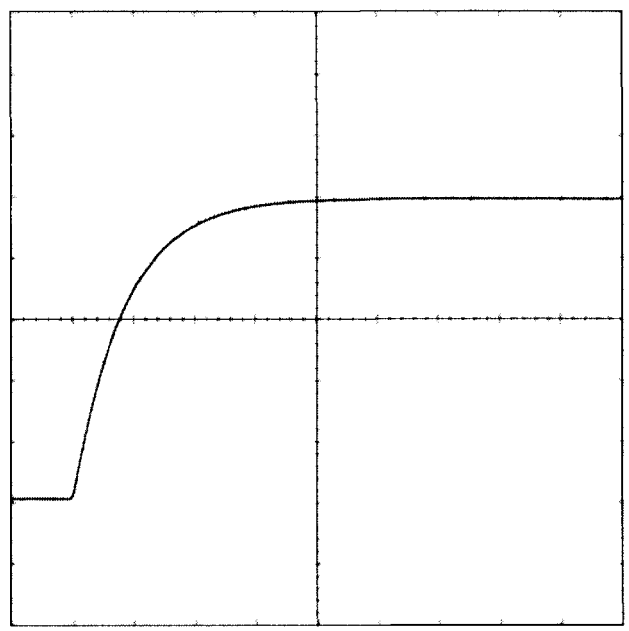
Figure 17D:
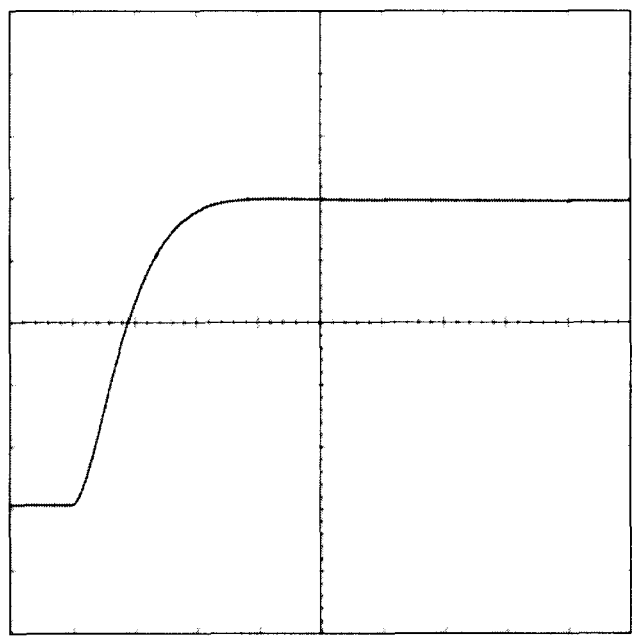
Figure 18A:
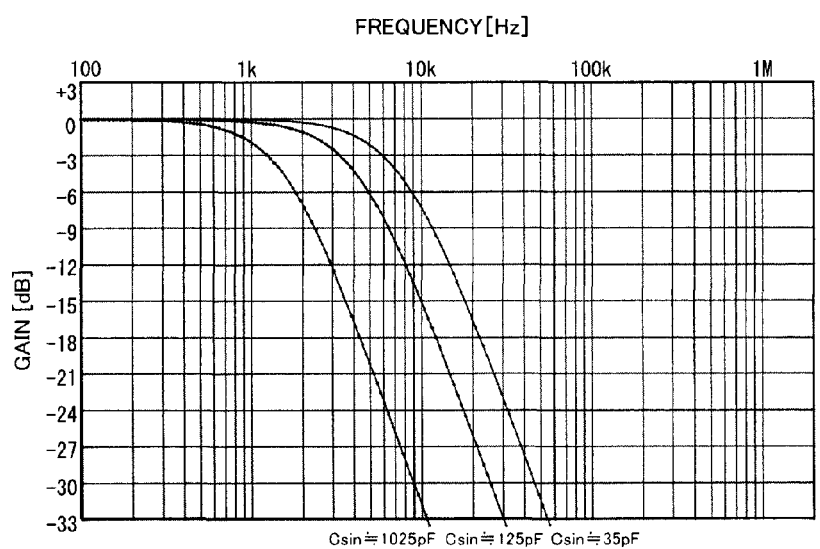
FIGS. 18A to 18D depict influence of the inverting input capacitance Csin in the current amplifier of the related art.
Figure 18B:
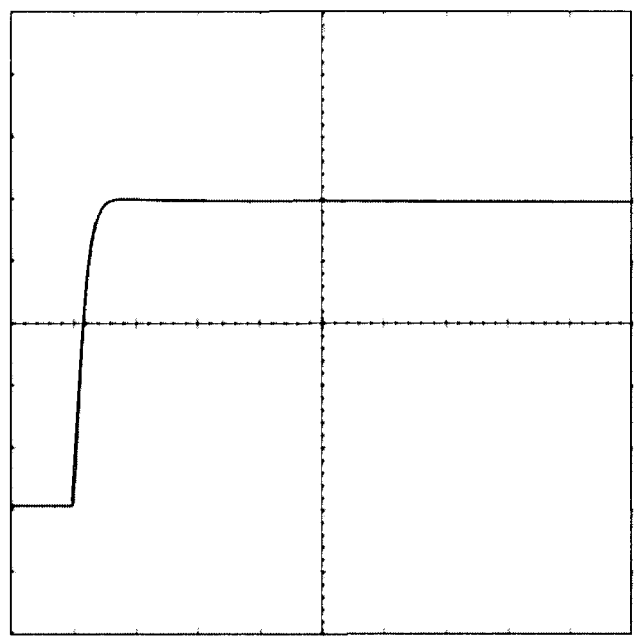
Figure 18C:
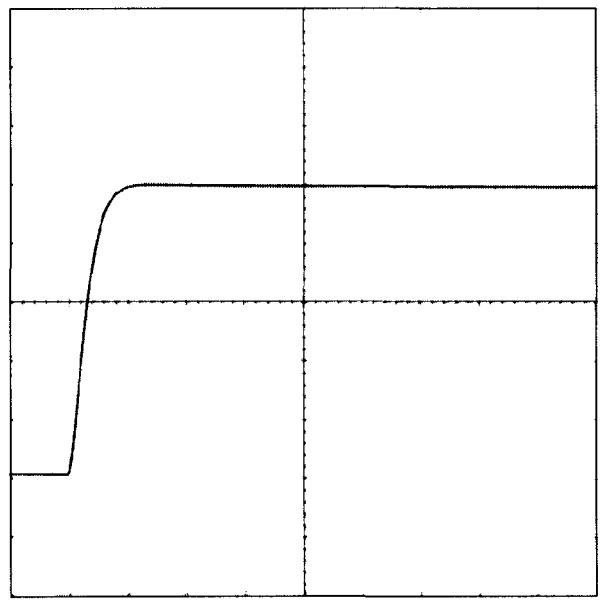
Figure 18D:
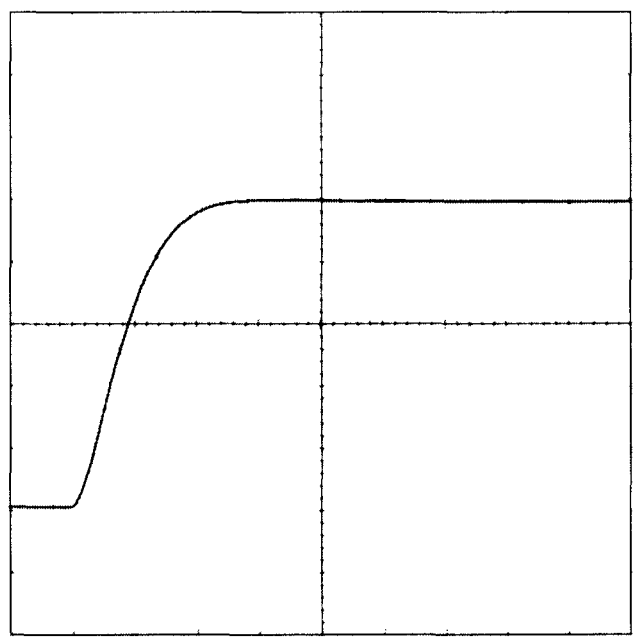
Figure 19:
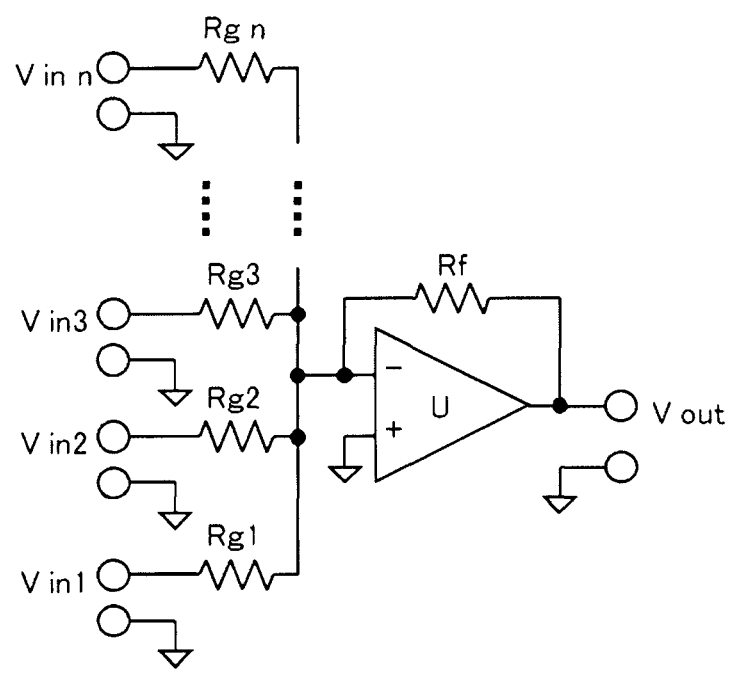
FIG. 19 depicts an example of the inverting input capacitance Csin in the voltage amplifier of the related art.
Figure 20:
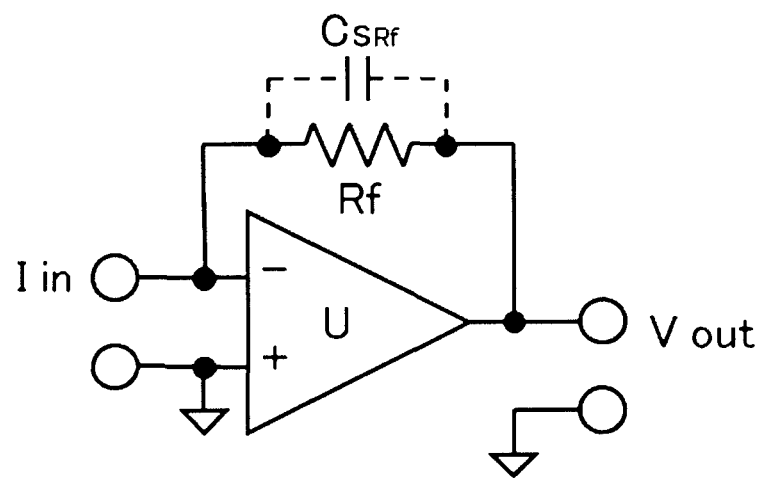
FIG. 20 depicts terminal capacitance $Cs_{Rf}$ of the feedback resistance Rf in the current amplifier of the related art.

If the feedback capacitance Cf is selected in accordance with the small inverting input capacitance Csin, the equivalent damping resistance $R_{DMP}$ becomes large. Thus, if the larger inverting input capacitance Csin is connected, damping is insufficient and the peak is generated in the frequency response (FIG. 16A). On the other hand, if the feedback capacitance Cf is selected in accordance with the large inverting input capacitance Csin, the damping resistance $R_{DMP}$ becomes small. Thus, if the smaller inverting input capacitance Csin is connected, too much damping causes the frequency response to deteriorate (FIG. 17A).

The above is the reason why the frequency response is changed according to the magnitude of the inverting input capacitance Csin in the related art.

It is found that to solve such a problem, the open loop gain in the low frequency range is kept even in wider bandwidth, and sufficient gain is also kept in a frequency range that is actually used, so that the input impedance Zin may work like resistance in a frequency range that is actually used. This is because a parallel resonant circuit is not configured along with the inverting input capacitance Csin when the input impedance Zin does not work like inductance but works like resistance.

However, to obtain sufficient open loop gain in the low frequency range and to achieve a broadband while keeping that gain are conflicting conditions. It is extremely difficult for one amplifier such as an op-amp to meet these two conditions. Thus, both of the above conflicting conditions are met by utilizing the configuration of a plurality of amplifiers, each of which negative feedback is provided to, connected in series. Description thereof will be provided below.

Figure 21D:
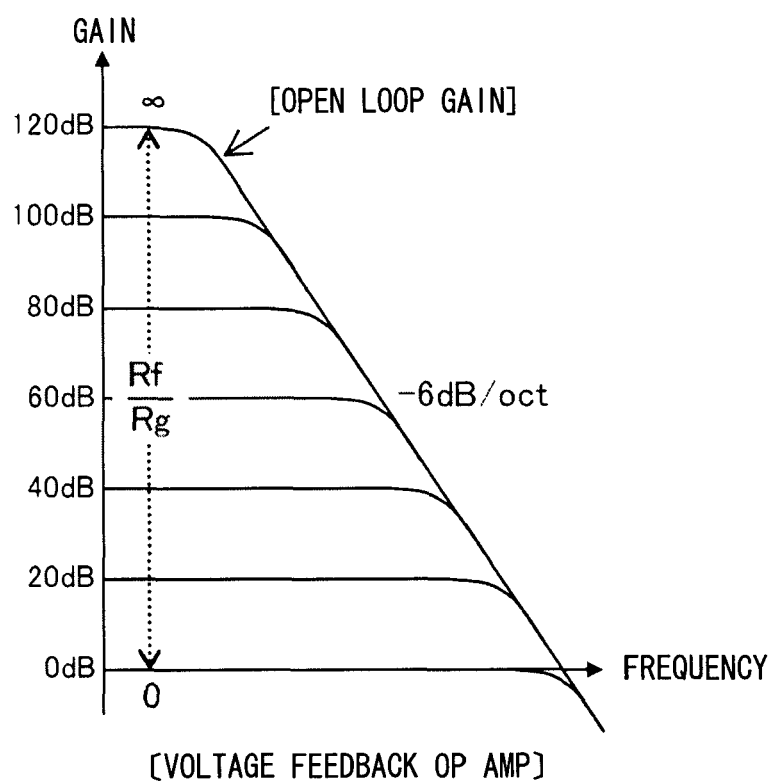

FIG. 21D depicts the frequency response of the open loop gain of a voltage feedback op-amp and the frequency response when negative feedback is provided. The depiction of the feedback resistance Rf and the gain resistance Rg is omitted. The feedback resistance Rf and the gain resistance Rg are as illustrated in a non-inverting amplifier depicted in FIG. 3A, an inverting amplifier depicted in FIG. 3B, etc. if the depiction thereof is necessary. The frequency response of the open loop gain decreases by slope of −6 dB/oct as also depicted in FIG. 21C.

If the gain is limited by negative feedback, the bandwidth becomes wider according to the limit. If the gain is limited to one tenth by the feedback resistance Rf and the gain resistance Rg, the bandwidth becomes wide by 10 times. For example, in the case of a voltage feedback op-amp whose gain in the low frequency range is 120 dB, the bandwidth when the gain is limited to 40 dB by the feedback resistance Rf and the gain resistance Rg is 10,000 times as wide as that in the open loop.

Figure 21E:
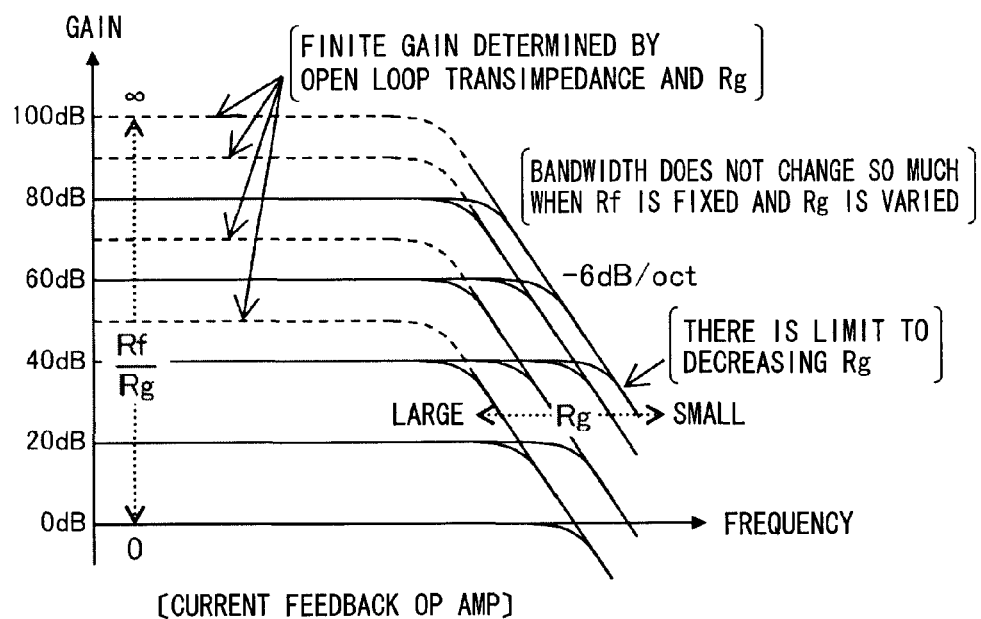

FIG. 21E depicts the frequency response of the open loop gain of a current feedback op-amp and the frequency response when negative feedback is provided.

The state where the feedback resistance Rf is infinite and Rf divided by Rg is infinite results in open loop. In this case, the gain in the low frequency range changes according to the magnitude of the gain resistance Rg. A dotted line in FIG. 21E depicts finite gain determined by open loop transimpedance and the gain resistance Rg. The bandwidth in the open loop state is almost fixed irrelevantly to the magnitude of the gain resistance Rg.

In the open loop state, the gain in the low frequency range is small if the gain resistance Rg is large, and in contrast, the gain in the low frequency range is large if the gain resistance Rg is small. However, if the gain resistance Rg becomes smaller than a certain limit (for example, 50Ω), the gain in the low frequency range cannot be larger.

For example, the gain in the low frequency range when the feedback resistance Rf is infinite is 90 dB in the case where the gain resistance Rg is the second smallest in FIG. 21E. If the gain is limited to 60 dB by selecting the feedback resistance Rf under the condition that the gain resistance Rg is the above value, the bandwidth is about 31.6 times (the difference between 90 dB and 60 dB: corresponding to 30 dB) as wide as that of the open loop state.

It is technically well known that a current feedback op-amp has wider bandwidth than a voltage feedback op-amp in principle, and that even if the gain resistance Rg is varied while the feedback resistance Rf is fixed, the bandwidth does not change so much.

As described above, it has been explained that an op-amp can be broadband if negative feedback is provided and the gain is limited as depicted in FIGS. 21D and 21E.

FIG. 1A is referred again with the above explanation as the premise. A voltage feedback op-amp, whose bandwidth is widened by the gain limited to, for example, 40 dB, is used for the non-inverting amplifier U1 near the input, to which negative feedback is individually provided. A current feedback op-amp, whose bandwidth is widened by the gain limited to, for example, 60 dB, is used for the inverting amplifier U2 near the output, to which negative feedback is individually provided. The current feedback op-amp has wider bandwidth than the voltage feedback op-amp. Thus, the current feedback op-amp realizes wider bandwidth although accounting for larger gain, and can ensure the sufficient staggered rate.

As a result of connecting two amplifiers U1 and U2, each of which negative feedback is provided to as the above, in series, the response equivalent to one op-amp, whose gain in the low frequency range is, for example, 100 dB, can be realized, and then, much wider bandwidth is realized. Thus, the input impedance Zin works like pure resistance in a frequency range which is actually used. Therefore, the effect can be realized that the change in the frequency response according to the magnitude of the inverting input capacitance Csin is a little.

Figure 21F:
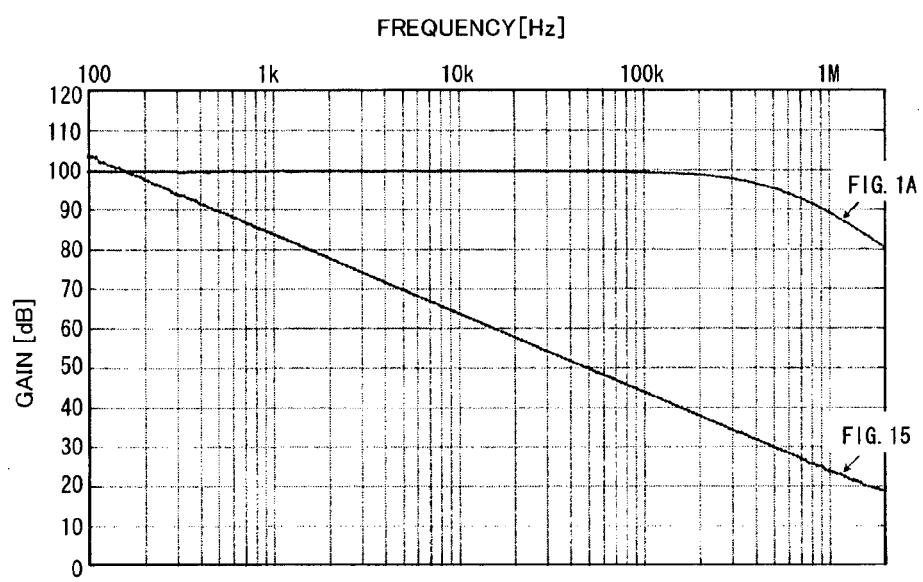

FIG. 21F depicts an example of achieving a broadband of the amplifier depicted in FIG. 1A in the form of the frequency response of the open loop gain.

It is found from the line of FIG. 15 in FIG. 21F that the open loop gain of the op-amp U in FIG. 15 decreases by slope of −6 dB/oct as the frequency is increasing from less than 100 Hz to more than 1 MHz. That is, the input impedance Zin works like inductance as described above in this range. Actually, the gain is 120 dB in the range below about a dozen hertz, and 0 dB at about a dozen megahertz.

On the other hand, concerning the line of FIG. 1A in FIG. 21F, the gain of the whole amplifier circuit of FIG. 1A that is configured by two amplifiers U1 and U2, which is connected in series and each of which negative feedback is provided to, is kept almost flat open loop gain in the range below about 100 kHz. The bandwidth (−3 dB point) is the value over 300 kHz. Thus, it is found that a broadband of about 20,000 times as wide as a dozen hertz of FIG. 15 in FIG. 21F can be realized. Further, the characteristic can be realized that the change in the frequency response according to the magnitude of the inverting input capacitance Csin is a little because the input impedance Zin works like resistance in the range below about 100 kHz.

When the whole gain in the low frequency range obtained by the amplifiers U1 and U2 connected in series is Av, the input impedance Zin of the current amplifier in the low frequency range is as the following formula (8).

Math. 8

$$Zin \approx \frac{Rf}{1 + Av} \tag{8}$$

If the gain Av=100 dB and the feedback resistance Rf=1 GΩ in the exemplified low frequency range, the input impedance Zin in the low frequency range is about 10 kΩ.

The bandwidth fc of the current amplifier in this case is as the following formula (9).

Math. 9

$$fc \approx \frac{1}{2\pi \cdot C\sin \cdot Zin} \approx \frac{1 + Av}{2\pi \cdot C\sin \cdot Rf} \tag{9}$$

It is found from the formula (9) that the bandwidth fc is inversely proportional to the inverting input capacitance Csin in the range where the input impedance Zin works like resistance. On the contrary, the bandwidth fc is inversely proportional to the root of the inverting input capacitance Csin like the above described formula (3) in the range where the input impedance Zin works like inductance in the related art.

The bandwidth fc when the inverting input capacitance Csin is about 10,025 pF and about 1,025 pF is calculatedly about 1.59 kHz and about 15.5 kHz, respectively, which corresponds to FIG. 2A. On the other hand, the gain Av starts to gradually decrease from about 100 kHz as depicted in FIG. 21F, and the input impedance Zin is changing from the resistance property to the inductance property. Thus, the bandwidth fc is narrower than that in the formula (9) when the inverting input capacitance Csin is about 125 pF and about 35 pF.

Second Embodiment

A second embodiment describes a variation on the first embodiment (a broadband amplifier circuit, in which the change in the frequency response according to the inverting input capacitance Csin is a little, is realized by its configuration of the non-inverting amplifier U1 and the inverting amplifier U2, each of which negative feedback is provided to, connected in series, to provide negative feedback from an output of the amplifier U2 near the output to an input of the amplifier U1 near the input). In the second embodiment, a plurality of amplifiers are connected in series.

Figure 3A:
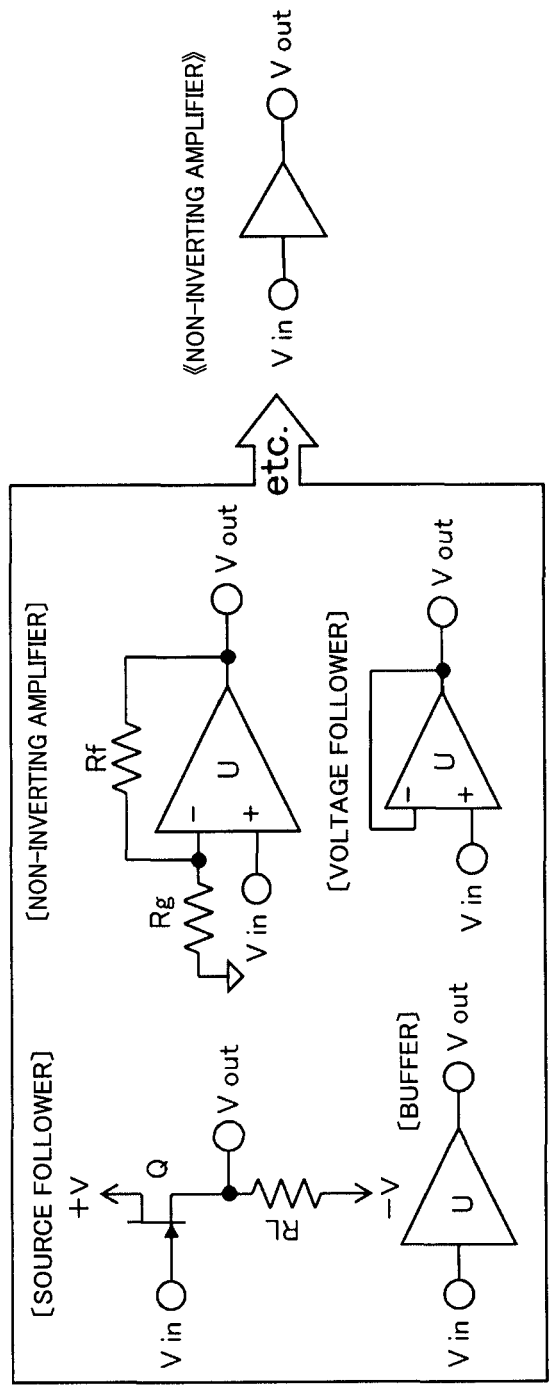
FIGS. 3A to 3E8 depict amplifier circuits according to a second embodiment.

In the second embodiment, a non-inverting amplifier is represented by a triangle symbol, which is commonly used, as depicted in FIG. 3A. The non-inverting amplifier may be a non-inverting amplifier using an op-amp, a voltage follower, a buffer amplifier and a follower circuit (follower) using an amplifier element, such as a source follower using a FET.

Figure 3B:
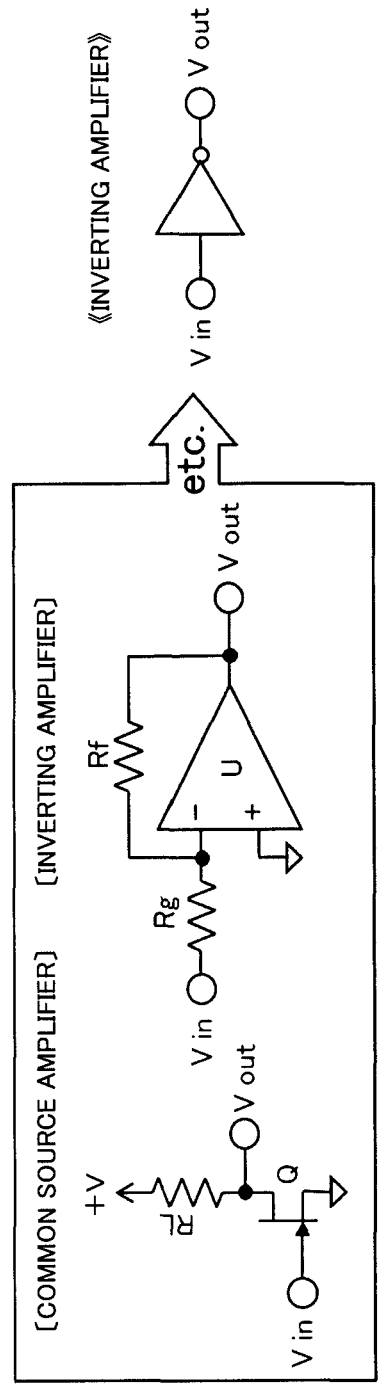

An inverting amplifier is represented by a triangle symbol where a circle is attached to the output as depicted in FIG. 3B. The inverting amplifier may be an inverting amplifier using an op-amp, and an amplifier using an amplifier element, such as a common source amplifier using a FET.

Using these representations, the current amplifier of FIG. 1A (the inverting input capacitance Csin is omitted) can be represented by FIG. 3C1. If the non-inverting amplifier and the inverting amplifier are interchanged, the current amplifier of FIG. 1A is represented by FIG. 3C2. When an op-amp to which negative feedback is provided is used, the input resistance of an inverting amplifier equals to the gain resistance Rg. Thus, a larger value of the gain resistance Rg is necessary when the input impedance is desired to be high, for example, when this art is applied to a current amplifier whose amplification factor is large. A current amplifier whose current amplification factor is large can take the configuration of FIG. 3C2 when an inverting amplifier, which can realize high input impedance without using an op-amp, such as the common source amplifier using a FET in FIG. 3B, is used.

Each of FIGS. 3D1 to 3D4 exemplifies the configuration of three amplifiers connected in series, and of providing negative feedback from an output to an input. The combination of these three amplifiers connected in series is either combination of all inverting amplifiers (FIG. 3D1), and one inverting amplifier and two non-inverting amplifiers (FIGS. 3D2 to 3D4) because three amplifiers connected in series as a whole are necessary to be an inverting amplifier circuit. It is preferable to use an inverting amplifier that can realize high input impedance because an inverting amplifier is used near the input in FIGS. 3D1 and 3D2.

Figure 8:
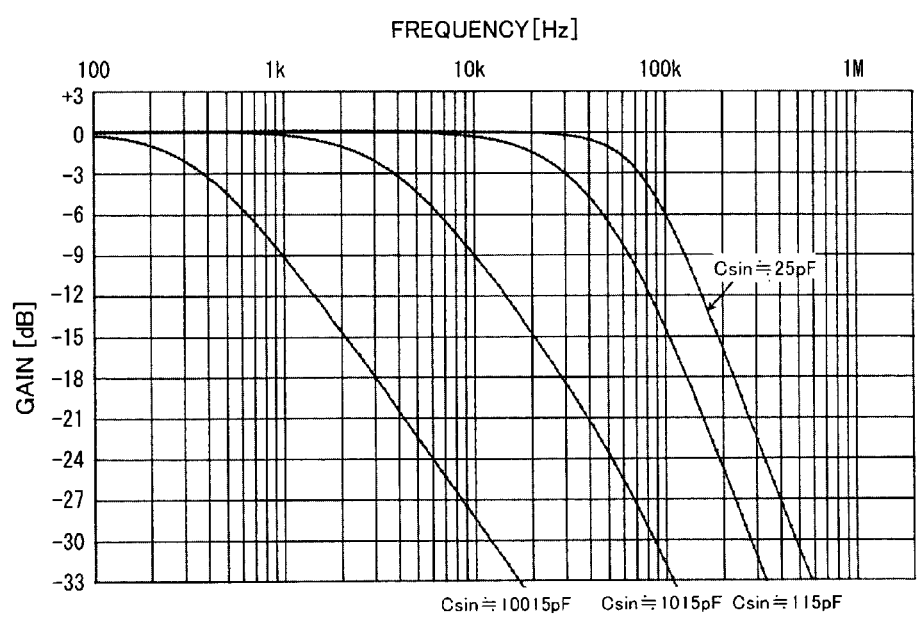

Each of FIGS. 3E1 to 3E8 exemplifies the configuration of four amplifiers connected in series, and of providing negative feedback from an output to an input. The combination of these four amplifiers connected in series is either combination of three inverting amplifiers and one non-inverting amplifier (FIG. 3E1 to 3E4), and one inverting amplifier and three non-inverting amplifiers (FIGS. 3E5 to 3E8) because four amplifiers connected in series as a whole are necessary to be an inverting amplifier circuit.

An example of connecting five or more amplifiers in series is obvious from the above exemplars, and thus is omitted. Odd inverting amplifiers are needed for making a plurality of amplifiers, connected in series, as a whole an inverting amplifier circuit no matter how many amplifiers are connected. The number of non-inverting amplifiers is optional.

Each of a plurality of amplifiers connected in series may be individual amplifier IC or an amplifier module. One amplifier IC or one amplifier module may be configured using some of plural amplifiers.

Figure 4A:
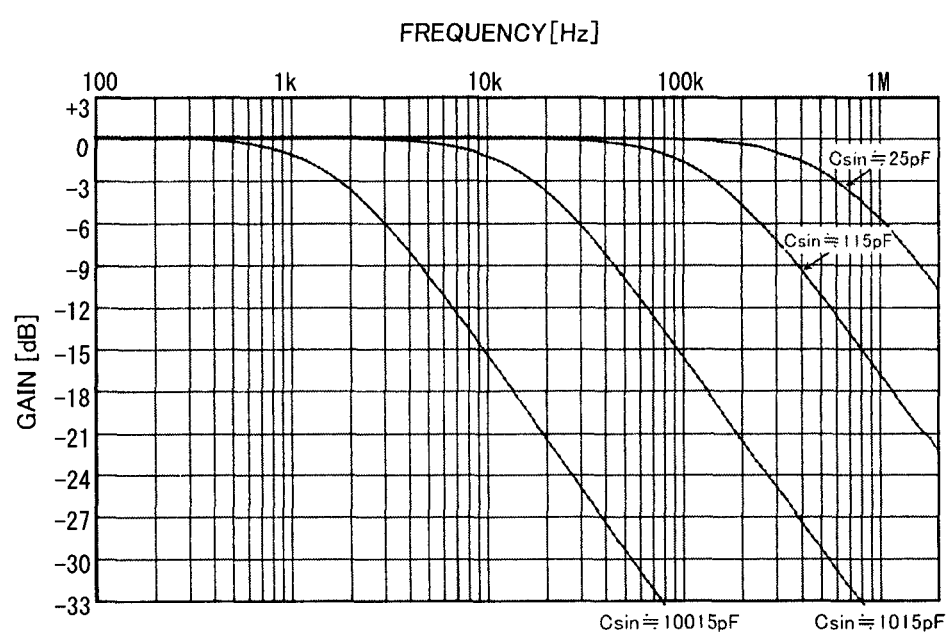
FIGS. 4A and 4B depict typical response of an amplifier circuit according to the second embodiment.
Figure 4B:
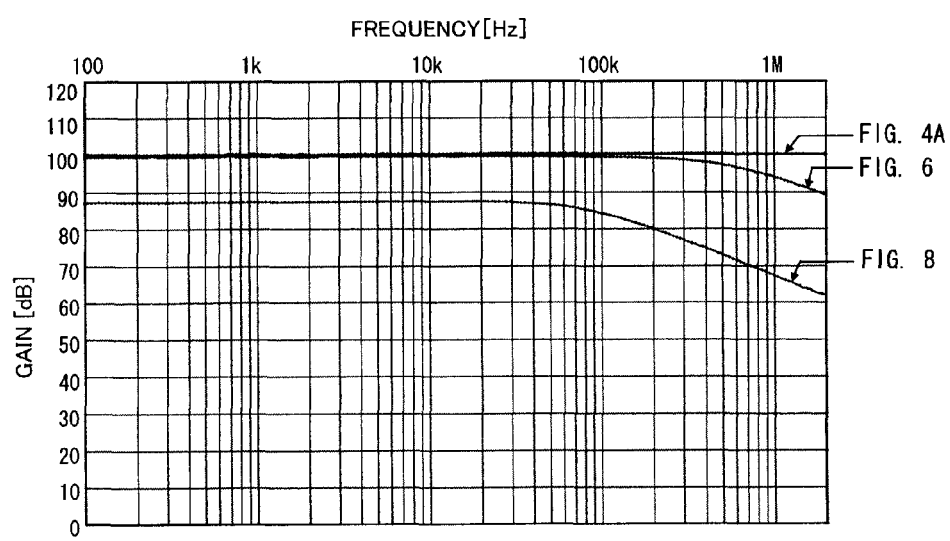

FIG. 4A depicts an example of the frequency response in three-stage configuration (corresponding to FIG. 3D4) of a non-inverting amplifier using a FET input op-amp that is configured by a discrete amplifier element etc. (gain in the low frequency range: 40 dB), a non-inverting amplifier using a current feedback op-amp (gain in the low frequency range: 30 dB) and an inverting amplifier using a current feedback op-amp (gain in the low frequency range: 30 dB). The line of FIG. 4A in FIG. 4B depicts an example of the frequency response of the open loop gain of a circuit of this configuration. It is found that the response depicted by the line of FIG. 4A is almost flat in the range to 1 MHz and over. The input impedance Zin works like resistance in the range to higher frequency than that of FIG. 2A, and of FIG. 1A in FIG. 21F when the response of FIG. 4A is compared with that of FIG. 2A, and of FIG. 1A in FIG. 21F. Thus, it is found that a broadband amplifier circuit, where the change in the frequency response according to the inverting input capacitance Csin is a little, can be realized.

Actually, the bandwidth of the open loop gain of FIG. 4A in FIG. 4B is about 10.2 MHz. The open loop gain below 1 MHz is about 100 dB as depicted in FIG. 4A in FIG. 4B. The above is about 1,020 GHz when represented by a commonly used gain bandwidth product. On the contrary, as to a commercial op-amp IC, it is rare that the gain bandwidth product is over 1 GHz. The maximum gain bandwidth product that the inventor knows about is 4 GHz. From the above, according to this embodiment, it can be also said that the gain bandwidth product over 100 times as large as that of a best commercial op-amp IC can be realized.

Table 1 depicts the comparison of the performance of the current amplifier of this embodiment when the inverting input capacitance Csin is not added (only the input capacitance of an amplifier and the stray capacitance of wiring and so on) with that of the current amplifier, which has the performance superior to any other that the inventor recognizes, which has the high amplification factor (transimpedance: $10^9$=1 GΩ) and which is low noise (see Datasheet LCA-4K-1G [online] by FEMTO Messtechnik GmbH, hereinafter referred to as FEMTO). It is found that the current amplifier in this embodiment realizes lower noise than FEMTO and the bandwidth over 200 times as wide as that of FEMTO while keeping the other performance and functions almost equal to FEMTO.

TABLE 1

| SPECIFICATIONS | | LCA-4K-1G | EXAMPLE OF EMBODIMENT |
|---|---|---|---|
| | TEST CONDITIONS | Vs = ±15 V, Ta = 25° C. | ← |
| GAIN | TRANSIMPEDANCE | $1 \times 10^9$ V/A (>10 kΩ Load) | ← |
| | ACCURACY | ±1% | ← |
| FREQUENCY RESPONSE | LOWER CUT-OFF FREQUENCY | DC | ← |
| | UPPER CUT-OFF FREQUENCY | 4 kHz (−3 dB) | 930 kHz (−3 dB) |
| | RISE-/FALL-TIME | 100 μs (10%~90%) | 0.37 μs (10%~90%) |
| | FLATNESS | ±0.1 dB | ← |
| INPUT | EQU. INPUT NOISE CURRENT | 6.5 fA/√Hz (@1 kHz) | 4.5 fA/√Hz (@1 kHz) |
| | EQU. INPUT NOISE VOLTAGE | 5 nV/√Hz (@1 kHz) | 2 nV/√Hz (@1 kHz) |
| | MAX. INPUT CURRENT | ±10 nA (Linear Amplification) | ← |
| OUTPUT | OUTPUT VOLTAGE | ±10 V (>10 kΩ Load) | ← |
| | OUTPUT IMPEDANCE | 50Ω (Terminate with >10 kΩ for best Performance) | ← |

Third Embodiment

A third embodiment describes a variation of using a follower as an amplifier near the input.

This follower may be an emitter follower using a bipolar transistor, a cathode follower using a vacuum tube, a voltage follower using an op-amp, and a follower using another amplifier element in addition to a source follower using a FET, which is expressed as a concrete example below. The follower may also be a non-inverting amplifier of the gain nearly equal to 1.

In the above described second embodiment, it is each of the two-stage configuration depicted in FIG. 3C1, the three-stage configuration depicted in FIGS. 3D3 and 3D4, and the four-stage configuration depicted in FIGS. 3E1 and 3E6 to 3E8 that uses a non-inverting amplifier at the input side. In the third embodiment, a follower, for example, a source follower using a FET is used as the amplifier near the input for the above configurations. A follower can be also used for more than four-stage configuration as an amplifier near the input.

A source follower using a FET has the characteristics of high input impedance while the gain is small, that is, a little less than 1. A source follower using a FET is useful for a current amplifier of the large current amplification factor because the input impedance of the amplifier near the input of this current amplifier needs to be set high.

A potential difference between input potential (gate voltage) and output potential (source voltage) in a source follower using a FET varies according to flowing current, but as an example, ranges from about 0.3 V to 1V. If a source follower using a FET is used in the third embodiment, gate-source voltage $V_{GS}$ needs to be compensated, and kinds of variations for compensating the gate-source voltage $V_{GS}$ can be conceived. In the third embodiment, every variation has the commonality, that is, a source follower using a FET is used as a non-inverting amplifier near the input, of a plurality of amplifiers connected in series.

Figure 5A:
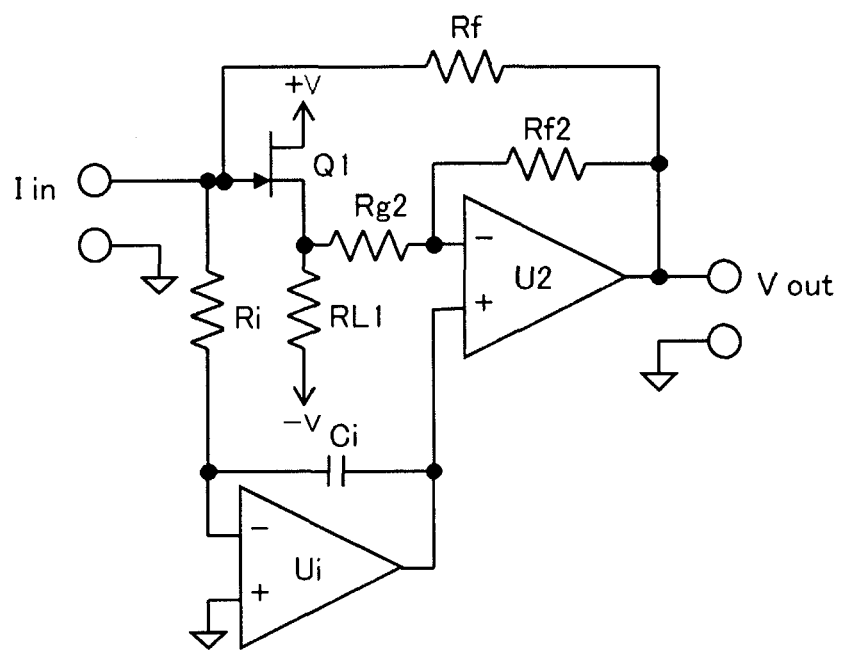

FIG. 5A depicts an example of compensating the gate-source voltage $V_{GS}$ using an integrator Ui. The configuration compensated by the integrator Ui is the almost same to JP 2005-064903 A. Even if the input impedance of the source follower using a FET is high, the input impedance of the integrator Ui is determined by the value of integral resistance Ri. Thus, input current is shunted to the integral resistance Ri to generate error. To make this error small, the integral resistance Ri is made to be much larger than the feedback resistance Rf.

Figure 5B:
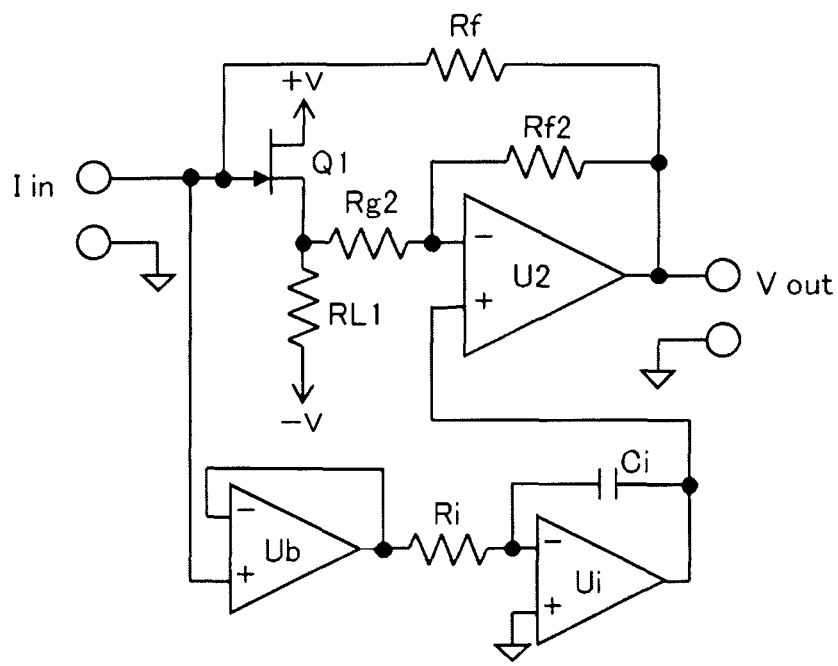

In this case, if a buffer amplifier Ub of high input impedance is added before the integrator Ui, the input impedance of the integrator Ui can increase irrelevantly to the integral resistance Ri. FIG. 5B illustrates utilizing a voltage follower using an op-amp as an example of this buffer amplifier Ub. In the illustration of FIG. 5B, signal output of a FET Q1 is inverted and amplified at the op-amp U2 near the output, and the output of the integrator U1 is non-inverted and amplified at the op-amp U2 near the output. As a result, the signal of the FET Q1 and the output of the integrator Ui, that is, compensating voltage is summed with reverse polarity.

In JP 2005-064903 A, the current feedback amplifier near the output (A2 of FIGS. 1 and 2 in JP 2005-064903 A) is an open loop. Thus, the technical feature of JP 2005-064903 A is different from the technical feature of this embodiment. JP 2005-064903 A does not have an equivalence to Rf2 of FIG. 5A. Negative feedback is not provided to the amplifier near the output individually in JP 2005-064903 A.

The output impedance of a source follower using a FET is not zero, but is a certain finite value. In FIGS. 5A and 5B, the output impedance of the source follower using a FET is added to gain resistance Rg2 of the inverting amplifier U2 near the output. Using this fact, the variation of using the output impedance of the source follower using a FET, as part of a value of the gain resistance Rg2 can be realized. The variations of using the output impedance of the source follower using a FET is used instead of the gain resistance Rg2 and omitting the gain resistance Rg2 can be also realized.

Each of FIGS. 5C to 5H illustrates the configuration of utilizing the source follower using a FET, and a circuit of the same circuit configuration as this source follower using a FET, fixing the input potential of this circuit, subtracting the gate-source voltage $V_{GS}$ of the source follower using a FET, and obtaining compensation. A source follower using a FET Q1 functions as the amplifier near the input, and a source follower using a FET Q1' is another circuit, and functions as a circuit of generating compensation voltage. In this time, offset error and drift can be suppressed by using two FETs of the same properties as far as possible. If these two FETs are thermally-coupled, offset error and drift can be suppressed further. In FIGS. 5C to 5H, the voltage $V_{GS}$ is generated between the gate terminal (input) of the FET Q1 and the source terminal (output) of the FET Q1; and in the FET Q1', the voltage $V_{GS}$, which is the same as that of the FET Q1 is generated between the gate terminal (input) connected to the reference potential and the source terminal (output). The voltage $V_{GS}$ of the FET Q1 is subtracted using the way such as giving the output of the FET Q1 and the FET Q1' to a differential amplifier, and the influence of the voltage $V_{GS}$ of the FET Q1 is compensated (cancelled) Each of FIGS. 5C to 5I illustrates a dual FET, but the embodiment is not limited to a dual FET.

Figure 5C:
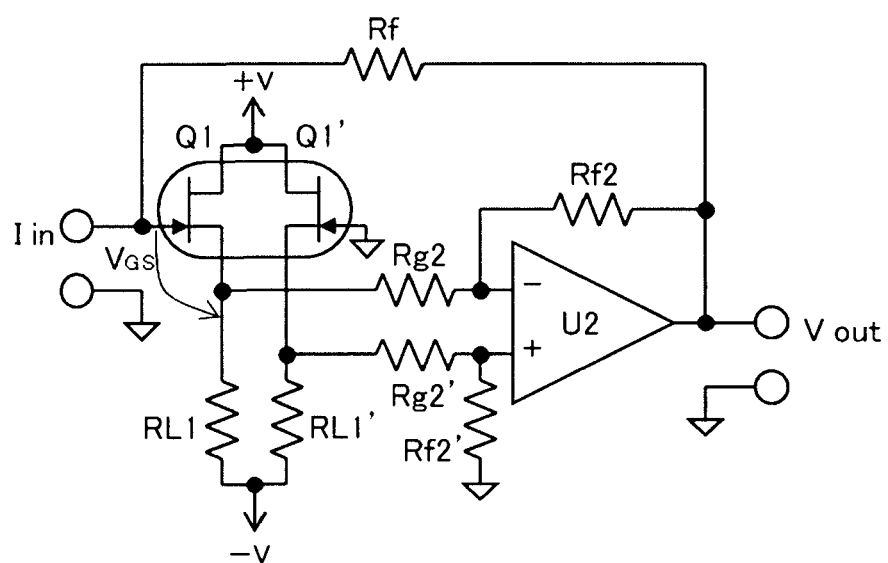

FIG. 5C depicts an example of utilizing the inverting amplifier using the op-amp U2 near the output as a differential amplifier to compensate the gate-source voltage $V_{GS}$ of the source follower using a FET.

Figure 5D:
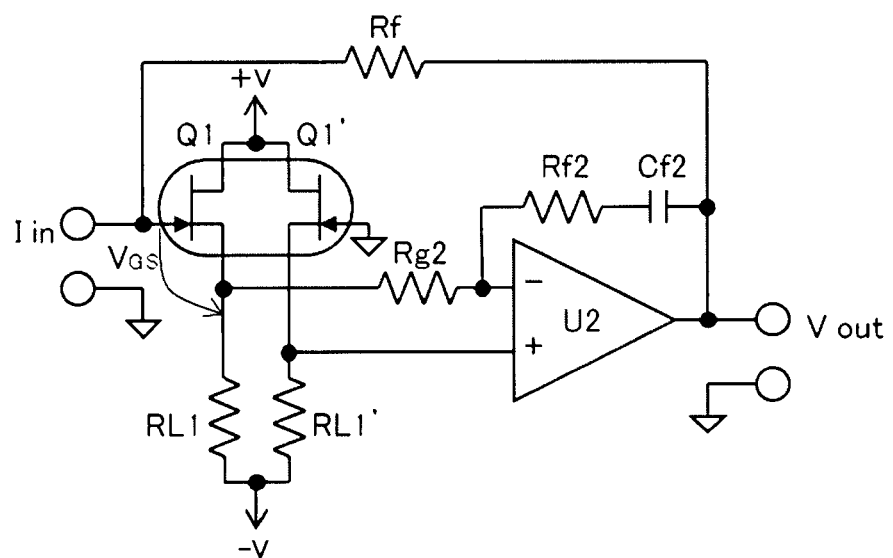

FIG. 5D depicts an example of connecting the capacitance (capacitor) Cf2 to the feedback resistance Rf2 in series to utilize an inverting amplifier using the op-amp U2 near the output as a differential amplifier that has an open loop only in the low frequency range. Larger gain than that of FIG. 5C can be obtained in the low frequency range where the differential amplifier works in the open loop state. Thus, the input impedance as a current amplifier can be lower in the low frequency range.

FIGS. 5E to 5I illustrate three-stage configurations.

Figure 5E:
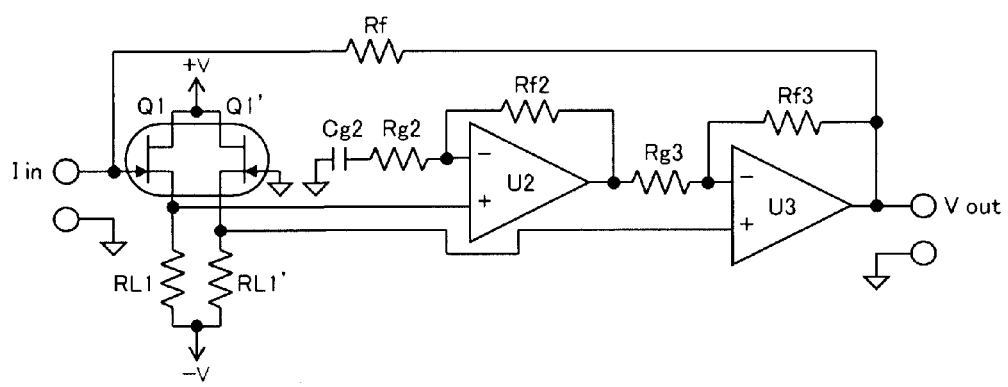

In FIG. 5E, a non-inverting amplifier using the op-amp U2 is used as the second-stage amplifier, and the capacitance Cg2 is connected to the gain resistance Rg2 in series. Thus, the gain seen from the non-inverting input in the low frequency range is 1, and the gain in the range over the above range is determined by the gain resistance Rg2 and the feedback resistance Rf2. Therefore, in the low frequency range, the gate-source voltage $V_{GS}$ is subtracted and compensation is obtained. Also, necessary gain is ensured as to alternating current component.

Figure 5F:
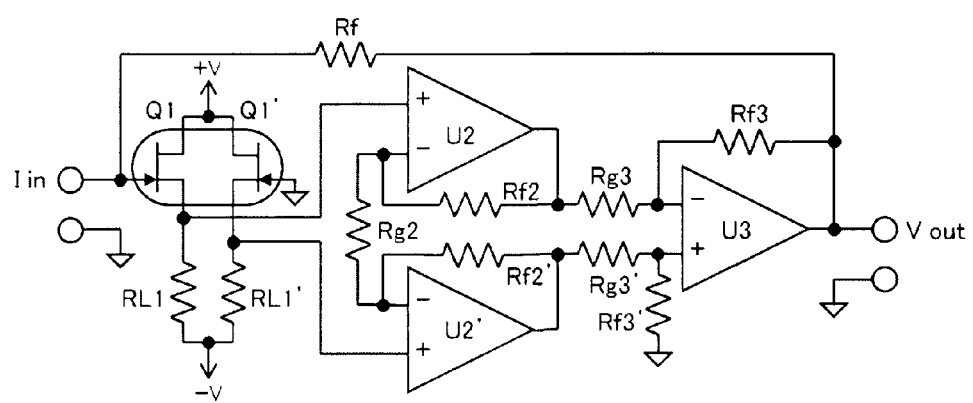

In FIG. 5F, the second-stage amplifier and the third-stage amplifier configure a differential amplifier of an instrumentation amplifier type, and the gate-source voltage $V_{GS}$ of the source follower using a FET is compensated. A differential amplifier of an instrumentation amplifier type may be used, if necessary, for a differential amplifier used in other embodiments.

Figure 5G:
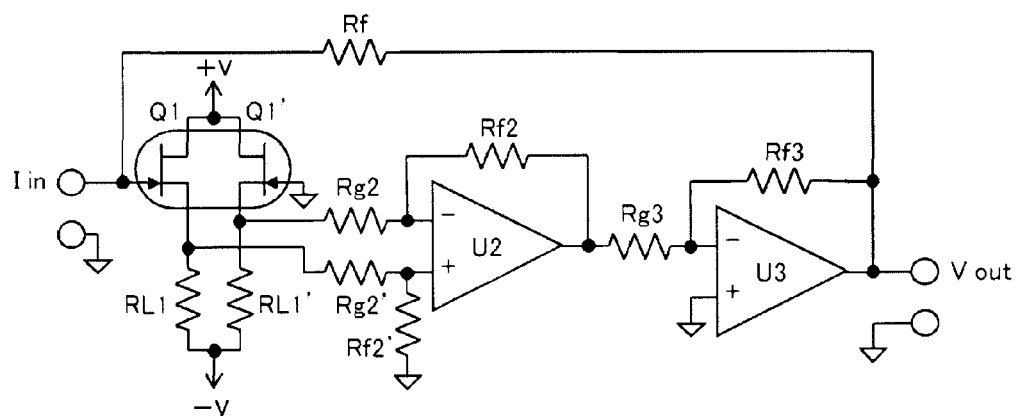
Figure 5H:
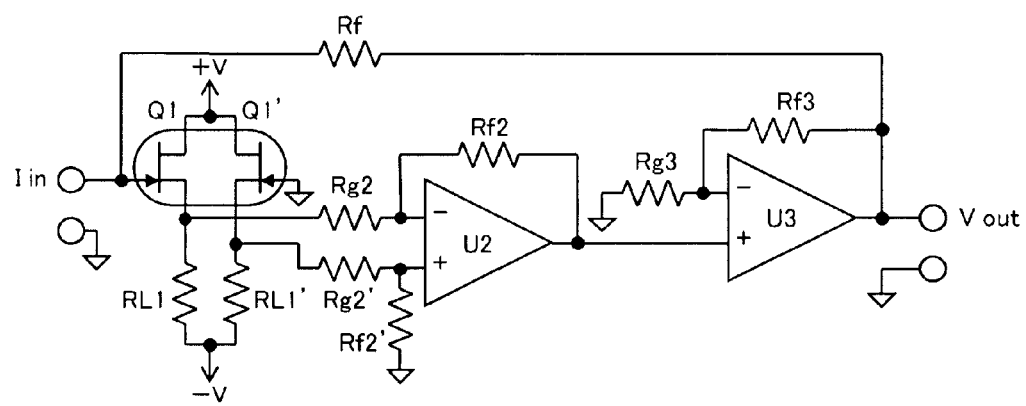
Figure 51:
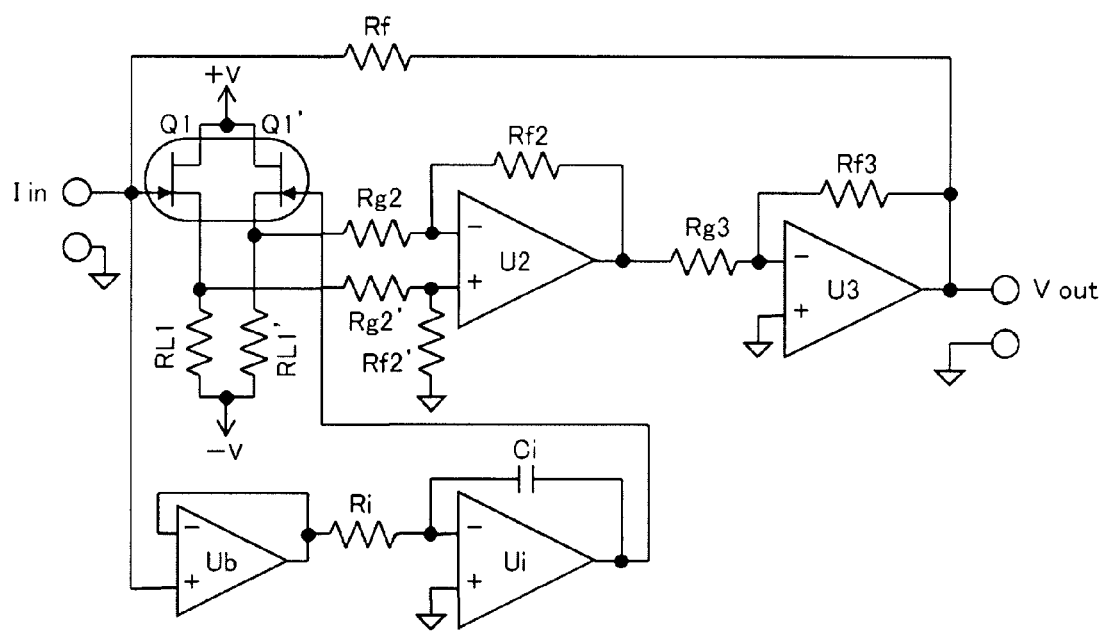

In FIGS. 5G and 5H, the gate-source voltage $V_{GS}$ of the source follower using a FET is compensated using a differential amplifier as the second-stage. While in FIG. 5G, the second-stage is a non-inverting amplifier for an input signal and the third-stage is an inverting amplifier for an input signal, in FIG. 5H, the second-stage is an inverting amplifier for an input signal and the third-stage is a non-inverting amplifier for an input signal. This concept can be applied to other variations. For example, in FIG. 5I, the second stage can be an inverting amplifier and the third-stage can be a non-inverting amplifier.

FIG. 5I is based on FIG. 5G. In FIG. 5I, the buffer amplifier Ub and the integrator Ui, which are the same to those of FIG. 5B, are added and thus, superior offset voltage and drift performance are obtained. The method of adding a buffer amplifier and an integrator to obtain superior offset voltage and drift performance is applicable not only to FIG. 5G but also to other variations.

The output impedance of a source follower using a FET is not zero, but is a certain finite value. In FIGS. 5G to 5I, the output impedance of the source follower using a FET is added to the gain resistances Rg2 and Rg2' of the inverting amplifier U2. Using this fact, the variation of using the output impedance of the source follower using a FET, as part of values of the gain resistances Rg2 and Rg2' can be realized. The variation of using the output impedance of the source follower using a FET is used instead of the gain resistances Rg2 and Rg2' and omitting the gain resistances Rg2 and Rg2' can be also realized.

Figure 6:
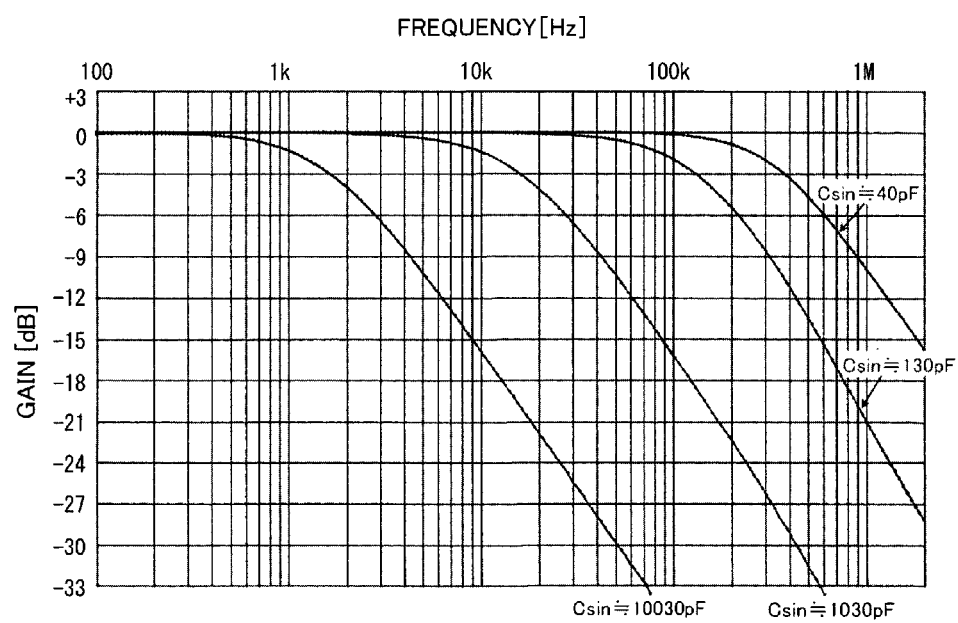
FIG. 6 depicts typical response of an amplifier circuit according to the third embodiment.

FIG. 6 depicts an example of the frequency response of an example of FIG. 5I. The frequency response of the open loop gain of an example of FIG. 5I is represented by the line of FIG. 6 in FIG. 4B.

Fourth Embodiment

A fourth embodiment describes a variation of utilizing an amplifier using an amplifier element as the amplifier near the input.

The amplifier using an amplifier element may be a common gate amplifier using a FET, a common emitter amplifier and a common base amplifier each of which uses a bipolar transistor, a common cathode amplifier and a common grid amplifier each of which uses a vacuum tube, and an amplifier using another amplifier element in addition to a common source amplifier using a FET, which is expressed as a concrete example below. Basically, the absolute value of the gain of the amplifier using an amplifier element is more than 1. An amplifier to which negative feedback is not provided individually is meant (except local negative feedback). A circuit for speeding-up etc. can be added if necessary. One amplifier can be configured by amplifiers of plural-stages. One non-inverting amplifier can be configured by connecting even inverting amplifiers using amplifier elements in series. An amplifier, to which negative feedback is individually provided, is regarded as an op-amp.

In the second embodiment, it is each of the two-stage configuration depicted in FIG. 3C2, the three-stage configurations depicted in FIGS. 3D1 and 3D2, and the four-stage configurations depicted in FIGS. 3E2 to 3E5 that uses an inverting amplifier at the input side. In the fourth embodiment, an amplifier using an amplifier element, for example, a common source amplifier using a FET is used as the inverting amplifier near the input for the above configurations. An amplifier using an amplifier element can be also used for more than four-stage configuration as an inverting amplifier near the input.

For example, the gain ranging from 30 to 40 dB is obtained from a common source amplifier using a FET, and a common source amplifier using a FET has the characteristic of high input impedance. Such characteristic is effective in setting high input impedance for the amplifier near the input in case of a current amplifier of the large current amplification factor.

Each of FIGS. 7A to 7D depicts an example of connecting a source terminal of the common source amplifier using a FET to negative voltage ($-V_B$). A source terminal can be grounded in a case of a depletion-type FET.

A potential difference between input potential (gate voltage) and output potential (drain voltage) in a common source amplifier using a FET is designed so as to be about several volts as an example. If a common source amplifier using a FET is used in the fourth embodiment, gate-drain voltage $V_{GD}$ needs to be compensated, and kinds of variations for compensating the gate-drain voltage $V_{GD}$ can be convinced. In the fourth embodiment, every variation has the commonality, that is, a common source amplifier using a FET is used as an inverting amplifier near the input, of a plurality of amplifiers connected in series.

Figure 7A:
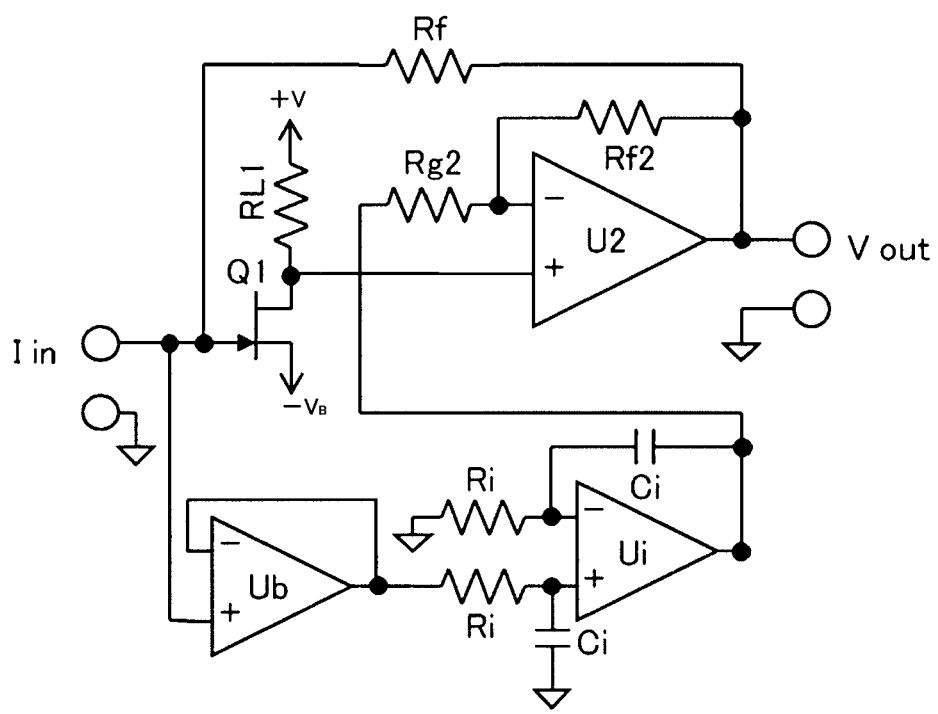
FIGS. 7A to 7D depict amplifier circuits according to a fourth embodiment.

FIG. 7A depicts an example of compensating the gate-drain voltage $V_{GD}$ using an integrator. To exploit the high input impedance of the common source amplifier using a FET, the buffer amplifier Ub that has high input impedance, for example, a voltage follower using an op-amp is added before the integrator Ui. The configuration of adding an inverting amplifier after the integrator is also possible. Here, the configuration of using the integrator as a differential integrator is exemplified. In the illustration of FIG. 7A, signal output of a FET Q1 is non-inverted and amplified at the op-amp U2 near the output, and the output of the integrator Ui is inverted and amplified at the op-amp U2 near the output. As a result, the signal of the FET Q1 and the output of the integrator Ui, that is, compensating voltage is summed with reverse polarity.

Figure 7B:
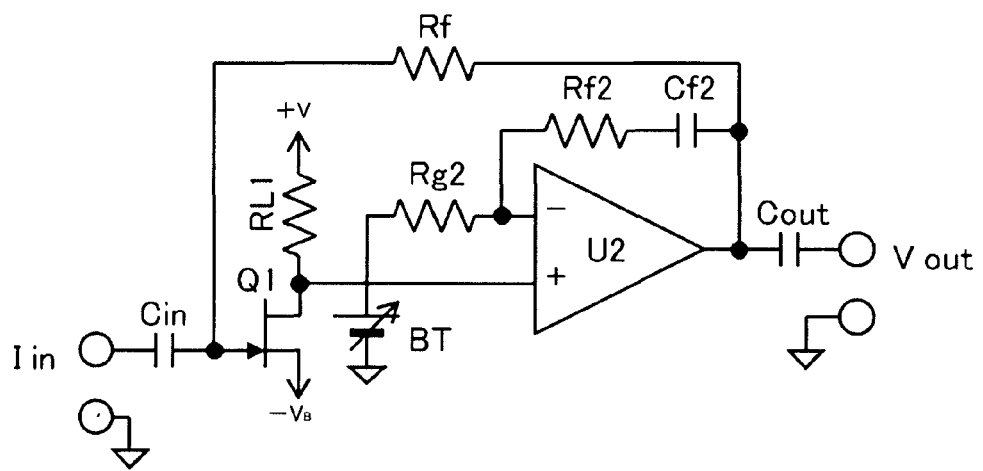

FIG. 7B illustrates the configuration where the amplifier U2 near the output is made to be an open loop in the low frequency range by connecting the capacitance Cf2 to the feedback resistance Rf2 in series, negative feedback is provided so that the drain voltage of the FET Q1 of the amplifier near the input matches voltage of a direct current voltage source BT, and the gate-drain voltage $V_{GD}$ is compensated. Further, the configuration that input and output are AC-coupled by capacitance Cin and Cout, respectively, for completely removing direct current offset and drift is also illustrated. AC-coupling can be also used in other variations if necessary.

Figure 7C:
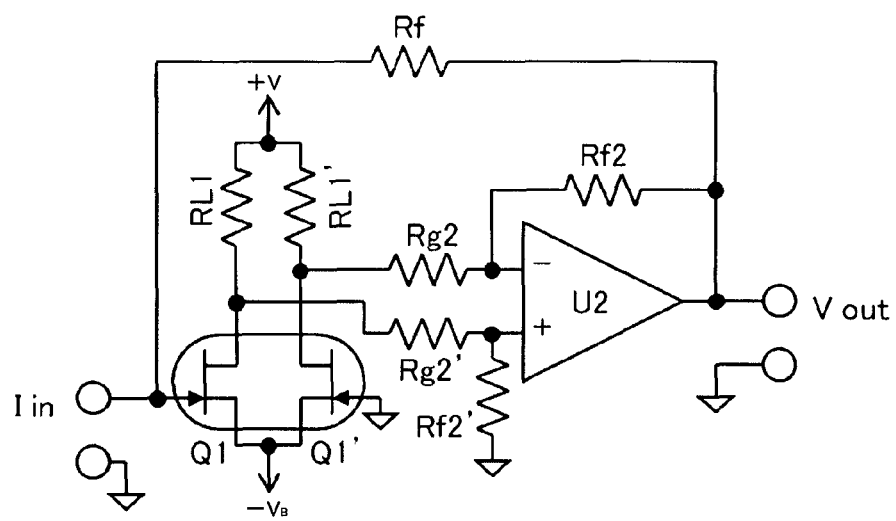

FIG. 7C depicts an example of using the non-inverting amplifier U2 near the output as a differential amplifier to compensating the gate-drain voltage $V_{GD}$ of the common source amplifier using a FET. The way to compensate voltage is the same to FIG. 5C. Any way same to FIGS. 5D to 5I can be used as another compensating method.

Figure 7D:
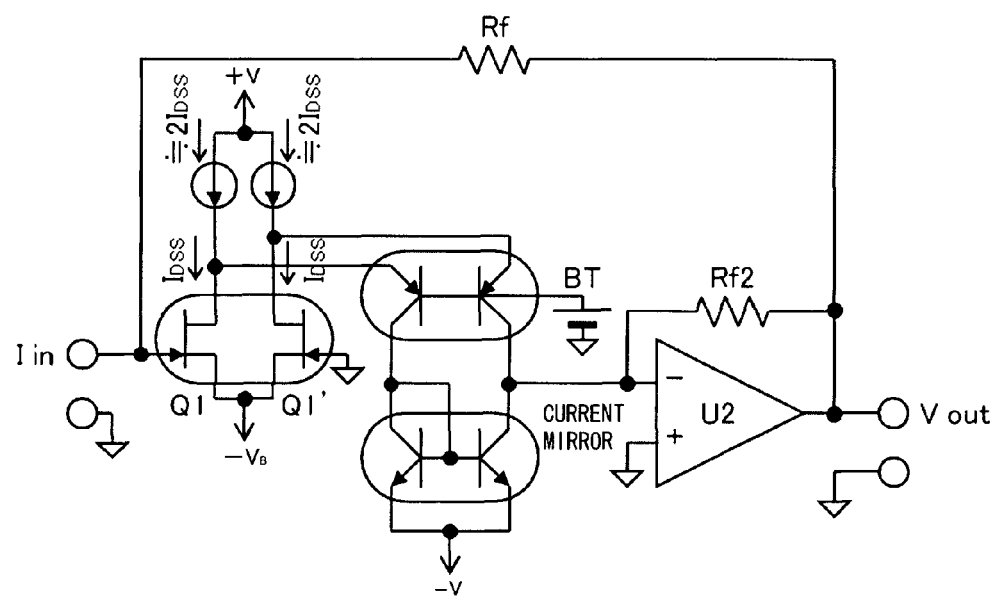

FIG. 7D depicts an example of compensating the gate-drain voltage $V_{GD}$ of the common source amplifier using a FET at a second-stage common base amplifier using a bipolar transistor, obtaining a single-end using a current mirror, and providing an inverting amplifier using an op-amp at the output side.

Each of FIGS. 7C and 7D illustrates the configuration of utilizing the common source amplifier using a FET, and another circuit whose input potential is fixed and which has the same circuit configuration as this common source amplifier using a FET. An amplifier using the FET Q1 functions as the amplifier near the input, and an amplifier using the FET Q1' is the other circuit and functions as a circuit of generating compensation voltage. In FIGS. 7C and 7D, the voltage $V_{GD}$ is generated between the gate terminal (input) of the FET Q1 and the drain terminal (output) of the FET Q1; and in the FET Q1', the voltage $V_{GD}$, which is the same as that when the input of the FET Q1 is reference potential, is generated between the gate terminal (input) connected to the reference potential and the drain terminal (output). The voltage $V_{GD}$ of the FET Q1 is subtracted using the way such as giving the output of the FET Q1 and the FET Q1' to a differential amplifier, and the influence of the voltage $V_{GD}$ of the FET Q1 is compensated (canceled).

FIG. 8 depicts an example of the frequency response of FIG. 7D. The response represented by the line of FIG. 8, which is depicted in FIG. 4B, is the frequency response of the open loop gain of FIG. 7D. The open loop gain in the range below tens of kilohertz is about 87 dB, and is smaller than 100 dB, which is exemplified in other embodiments. The bandwidth fc is narrower than that in other embodiments if the inverting input capacitance Csin is the same because the bandwidth fc is affected by the gain Av in the low frequency range as expressed in the formula (9).

Fifth Embodiment

A fifth embodiment describes a variation of further adding an output buffer Uob after the amplifier near the output.

An output buffer is a kind of a non-inverting amplifier whose gain is about 1. An output buffer takes the effects of increasing current that the output can drive, and decreasing output impedance. The functionality of an output buffer is almost same to the above described follower. An IC that is only for the buffering purpose, a voltage follower using an op-amp, and a discrete amplifier configured by a FET, a bipolar transistor or the like can be used for this output buffer.

Even inverting amplifiers may be used for using a plurality of amplifiers, connected in series, as a whole as an inverting amplifier circuit. The number of non-inverting amplifiers is optional. An output buffer is also a kind of a non-inverting amplifier. Thus, using an output buffer does not affect a type or the number of other amplifiers.

Figure 9:
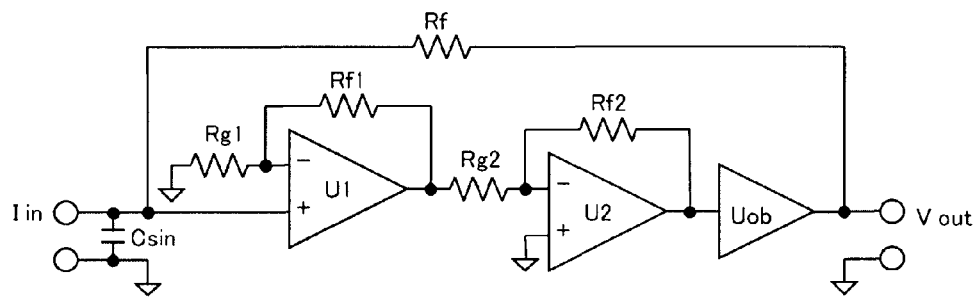
FIG. 9 depicts an amplifier circuit according to a fifth embodiment.

FIG. 9 depicts an example of adding the output buffer Uob to the configuration of FIG. 1A. The output buffer Uob can be added in every embodiment.

Sixth Embodiment

The sixth embodiment is an example of a feedback circuit that realizes resistance whose terminal capacitance is equivalently zero.

In the above described embodiments, there is a case where it is not necessary to add the feedback capacitance Cf to the feedback resistance Rf in parallel, and moreover, where only the terminal capacitance $Cs_{Rf}$ (for example, a little less than 0.1 pF) of the feedback resistance Rf is too large to be the feedback capacitance Cf when the feedback resistance Rf is large (for example, 1 GΩ), so the performance cannot be exerted enough. In order to avoid such inconvenience, the feedback circuit that realizes resistance whose terminal capacitance is equivalently zero is configured in the sixth embodiment.

Figure 10A:
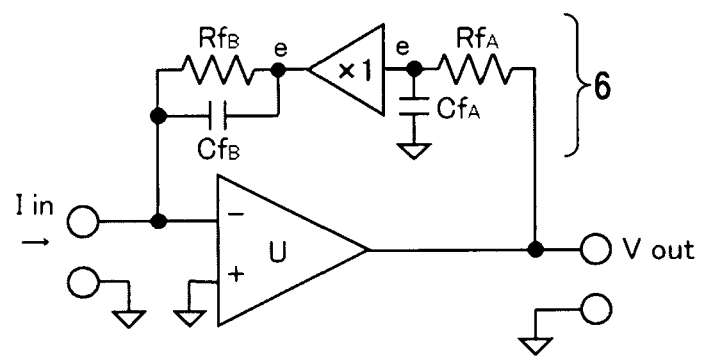
FIGS. 10A to 10C depict feedback circuits according to a sixth embodiment.
Figure 10B:
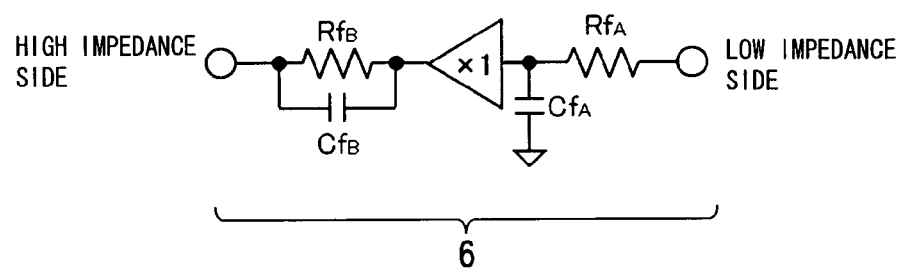

FIG. 10A illustrates a current amplifier to which this feedback circuit 6 is applied. Here, input current is Iin (the arrow in FIG. 10A indicates a positive direction) and output voltage is Vout. "×1" in each of FIGS. 10A and 10B depicts a buffer amplifier. Input and output voltage of the buffer amplifier is e.

Transfer functions of the feedback circuit 6 then are as the following formulae (10) and (11).

Math. 10

$$\frac{e}{Vout} = \frac{1}{1 + j\omega \cdot Cf_A \cdot Rf_A} \quad (10)$$

Math. 11

$$\frac{-Iin}{Vout} = \frac{\frac{1}{1 + j\omega \cdot Cf_A \cdot Rf_A}}{\frac{1}{Rf_B} + \frac{1}{j\omega \cdot Cf_B}} = \frac{\frac{1}{Rf_B} + j\omega \cdot Cf_B}{1 + j\omega \cdot Cf_A \cdot Rf_A} \quad (11)$$

Thus, the gain of the current amplifier can be expressed by the following formula (12).

Math. 12

$$\frac{Vout}{-Iin} = Rf_B \times \frac{1 + j\omega \cdot Cf_A \cdot Rf_A}{1 + j\omega \cdot Cf_B \cdot Rf_B} \quad (12)$$

Here, when the following formula (13), that is, the following formula (14) is met, it is found that the gain of the current amplifier does not have frequency dependence.

Math. 13

$$1 + j\omega \cdot Cf_A \cdot Rf_A = 1 + j\omega \cdot Cf_B \cdot Rf_B \quad (13)$$

Math. 14

$$Cf_A \cdot Rf_A = Cf_B \cdot Rf_B \quad (14)$$

In this case, as expressed by the formula (12), this feedback circuit 6 functions as pure resistance whose terminal capacitance is zero and whose resistance value is $Rf_B$.

FIG. 10B depicts a portion of the feedback circuit 6 of FIG. 10A. In the feedback circuit 8 of FIG. 10C, one end of each resistance $Rf_A$ and capacitance $Cf_A$ is connected to the parallel circuit of resistance $Rf_B$ and capacitance $Cf_B$ without using a buffer amplifier. In this case, the voltage e is not affected even if there is no buffer amplifier under the condition that $Rf_B$ is much larger than $Rf_A$. Thus, the circuit of FIG. 10C can realize a feedback circuit 8 that is equivalent to resistance $Rf_B$ whose terminal capacitance is zero under the condition of the formula (14). The feedback circuit 8 of FIG. 10C functions as pure resistance of $Rf_A + Rf_B$ under the condition of the formula (14) even if $Rf_B$ is not much larger than $Rf_A$.

Figure 11A:
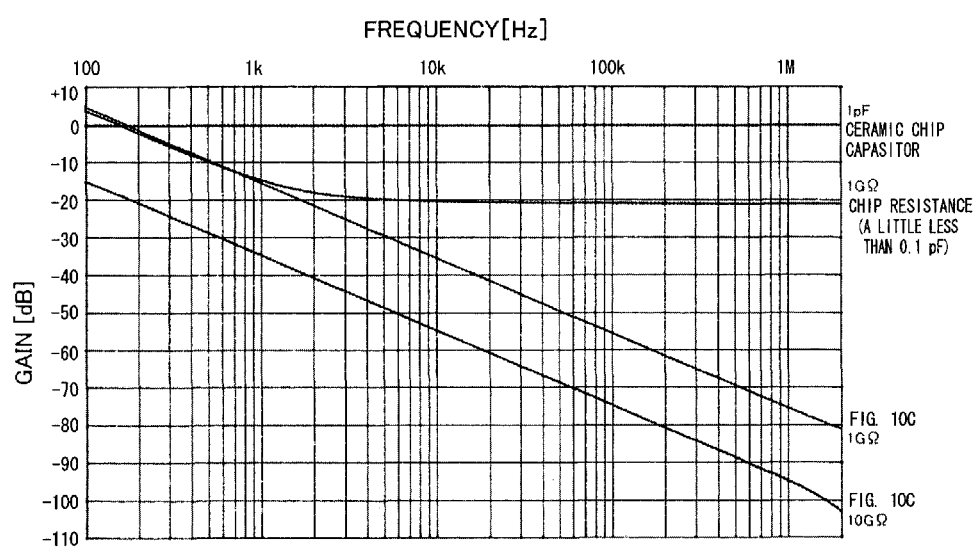
FIGS. 11A and 11B depict typical response of a feedback circuit and a frequency response measuring circuit according to the sixth embodiment.
Figure 11B:
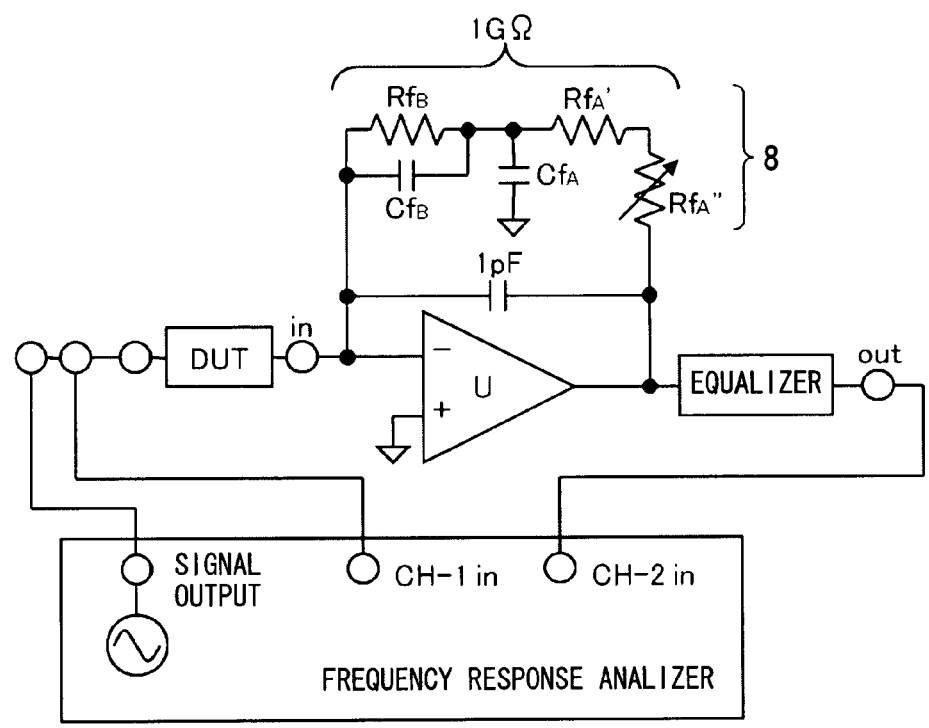

As depicted in FIG. 11B, the value of variable resistance $Rf_A''$ is varied, so that the formula (14) is met, in the feedback circuit 8 using the series circuit of resistance $Rf_A'$ and $Rf_A''$, instead of the resistance $Rf_A$. In this case, it is preferable that $Rf_B$ is set much larger than $Rf_A' + Rf_A''$ in order to suppress the change of the resistance value of the feedback circuit 8 according to the change of $Rf_A''$, within the permissible range. When $Rf_B$ is set much larger than $Rf_A' + Rf_A''$, the change of the resistance value of the feedback circuit 8 can be suppressed within the permissible range. For example, the change of the resistance value according to the change of $Rf_A''$ is hardly a problem if $Rf_B$ is over 100 times as large as $Rf_A' + Rf_A''$.

When $Cf_A$ is varied, so that the formula (14) is met, $Rf_B$ may not be much larger than $Rf_A$.

As depicted in FIG. 1B, variable resistance is used for part or whole of the resistance $Rf_A$, and the adjustment can be carried out so as to satisfy the formula (14). It is also possible to use variable capacitance (trimming capacitor or the like) for $Cf_A$ or $Cf_B$. Actually, variable resistance has an advantage in the variable range, a market, etc.

Figure 10C:
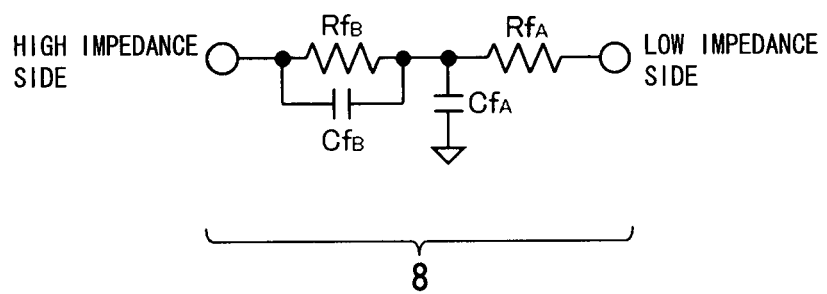

In FIGS. 10A to 10C etc., one end of $Cf_A$ is grounded. $Cf_A$ may be grounded alternately. For example, connection to a proper direct current voltage source etc. is also possible.

The configuration according to the sixth embodiment can be widely used as resistance whose terminal capacitance is equivalently zero, for feedback resistance and gain resistance which are used for an amplifier, reference resistance for measuring the frequency response of a current amplifier, and another use.

FIG. 11A depicts the frequency response of the feedback circuit etc. in order to verify the effect of the sixth embodiment.

This frequency response is measured by the measuring circuit of FIG. 11B, which is based on a charge amplifier. The frequency response is corrected by an equalizer, so that a flat frequency response is obtained when a reference capacitor of 1 pF is connected to a Device Under Test (DUT).

According to this measuring circuit, a capacitor presents a fixed value independently from the frequency response. If capacitance becomes one tenth, the output decreases by 20 dB. Resistance presents the value decreasing by –6 dB/oct as the frequency is increasing. If the resistance becomes 10 times larger, the output decreases by 20 dB.

For the reference, it can be found that a ceramic chip capacitor of 1 pF (that is mounted in a shielding case) keeps 0 dB in the whole range of the measured frequency.

When chip resistance of 1 GΩ decreases by –6 dB/oct below 1 kHz as the frequency is increasing, but keeps approximately –21 dB over 10 kHz. It is found from the fact that the terminal capacitance $Cs_{Rf}$ of this chip resistance of 1 GΩ is about 0.09 pF.

Resistance of 1 GΩ, whose terminal capacitance is made to be equivalently zero by the circuit of FIG. 10C, presents almost the same value as the chip resistance of 1 GΩ below 1 kHz. Resistance of 1 GΩ also presents the value decreasing by –6 dB/oct in the whole range of the measured frequency. That is, it is indicated that in the whole range of the measured frequency, resistance whose terminal capacitance is equivalently zero can be realized. Resistance of 10 GΩ, whose terminal capacitance is made to be equivalently zero by the circuit of FIG. 10C also presents the value decreasing by 6 dB/oct below 1 MHz. However, the value slightly shifts over 1 MHz. That is, it is indicated that resistance whose terminal capacitance is equivalently zero can be realized below 1 MHz.

According to the feedback circuit of the sixth embodiment, the deterioration of the bandwidth fc caused by the influence of the terminal capacitance $Cs_{Rf}$ of the feedback resistance Rf can be prevented, and thus, the bandwidth fc which is wide can be realized. This effect is outstanding especially when the feedback resistance Rf is large.

Seventh Embodiment

A seventh embodiment depicts an example of a feedback circuit that can realize equivalently smaller, and adjustable capacitance.

In the above described embodiments, there is a case where it is not necessary to add the feedback capacitance Cf to the feedback resistance Rf in parallel, and where the performance is exerted by the feedback circuit of the sixth embodiment, which realizes resistance whose terminal capacitance is equivalently zero. In this case however, there also occurs a case where very small feedback capacitance is desired to be added in order to finish the performance of frequency response or the waveform of pulse response as desired. It is difficult to acquire the existing ceramic chip capacitor of less than 0.1 pF though. It is also difficult to acquire a commercial trimmer capacitor or piston trimmer of less than 0.1 pF as to adjustable capacitance. In the seventh embodiment, a feedback circuit that can realize equivalently smaller, and adjustable capacitance is configured in order to realize smaller feedback capacitance.

Figure 12A:
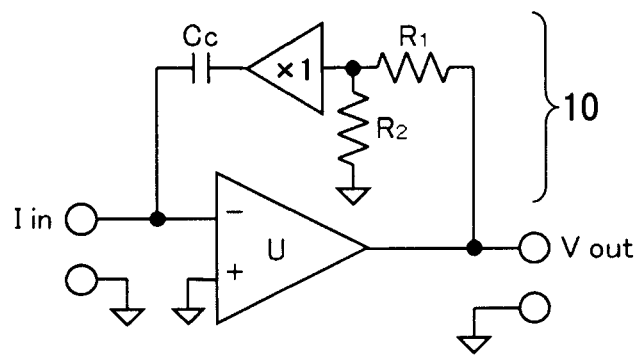
FIGS. 12A to 12C depict feedback circuits according to a seventh embodiment.
Figure 12B:
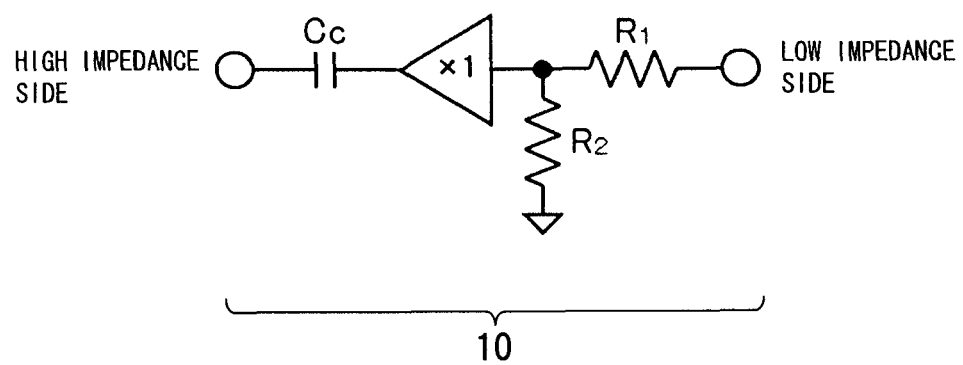

FIG. 12A illustrates a current amplifier to which the feedback circuit 10 of FIG. 12B is applied.

"×1" in each of FIGS. 12A and 12B represents a buffer amplifier. The output voltage of the current amplifier is divided by the resistances R1 and R2, and this divided voltage is given to the buffer amplifier. Therefore, the amount of a signal that is given to the input of the amplifier through capacitance Cc is also R2 divided by (R1+R2). Thus, the feedback circuit works as smaller capacitance equivalent to Cc×R2 divided by (R1+R2).

Figure 12C:
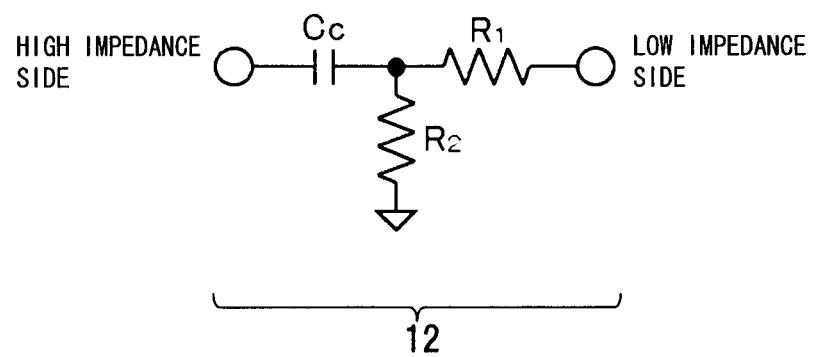

If the impedance of the capacitance Cc is much larger than the parallel resistance of the resistance R1 and R2 in the frequency range where the capacitance Cc effectively works as phase compensation etc., the feedback circuit without a buffer amplifier works the same as that with a buffer amplifier (FIG. 12C).

The feedback circuit 12 whose capacitance Cc is equivalently small capacitance according to the attenuation factor of an attenuator can be also realized if an end of the capacitance Cc is connected to an end of the resistance R1 and R2 without a buffer amplifier as depicted in FIG. 12C. It is noted that this feedback circuit 12 is equivalent to a circuit of connecting the parallel resistance of the resistance R1 and R2 to the equivalently small capacitance in series.

In this case, the problem is the relationship between the impedance of the capacitance Cc, and the parallel resistance of the resistance R1 and R2. When it cannot be said that the impedance of the capacitance Cc is much larger than the parallel resistance in the frequency range where the capacitance Cc effectively works as phase compensation etc, there is a case where a function of this feedback circuit 12 as pure capacitance is damaged, and the effect of needed phase compensation cannot be obtained. In this case, the problem occurs that peak and dip are generated in the frequency response of an amplifier circuit.

Thus, a value as follows is needed to be selected for the capacitance value of the capacitance Cc.

(1) It is necessary that the relationship between the capacitance value of the capacitance Cc and the value of the parallel resistance of the resistance R1 and R2 does not cause peak or dip that exceeds a permissible limit of the specification in the frequency response of an amplifier circuit.

(2) That is, it is necessary to select a capacitance value, so that the impedance of the capacitance Cc is larger than the value of the parallel resistance of the resistance R1 and R2 in the frequency range where the capacitance Cc effectively works as phase compensation etc.

If part or whole of either resistance R1 or R2 is variable resistance as illustrated in FIG. 1B, the feedback circuit can be used as an adjustable, and smaller capacitance than the capacitance Cc.

Each of FIGS. 12A to 12C etc. depicts an example of configuring an attenuator by the resistance R1 and R2. Any type of an attenuator may be used, and the feedback circuit works as smaller capacitance equivalent to Cc×(attenuation factor of the attenuator). Various types of attenuators exist such as an attenuator configured by two capacitors, by two inductors, by a transformer, and by two parallel circuits each of which is configured by a resistance and a capacitor. Capacitive coupling may be used between the attenuator and the output of an amplifier if necessary when an inductor or a transformer is used.

The configuration according to the seventh embodiment is not limited to the amplifier circuit of the present invention, but can be widely used as variable capacitance for the feedback capacitance of an amplifier and for another use as well.

Also, according to the feedback circuit of the seventh embodiment, capacitance that is much smaller than the terminal capacitance $Cs_{Rf}$ can be connected to the feedback resistance Rf in parallel. Thus, frequency response and the waveform of pulse response can be more optimized. Small capacitance that is difficult to be realized by the conventional art can also be realized, and capacitance is continuously variable.

Eighth Embodiment

An eighth embodiment exemplifies an effect of the sixth and seventh embodiments.

Figure 13A:
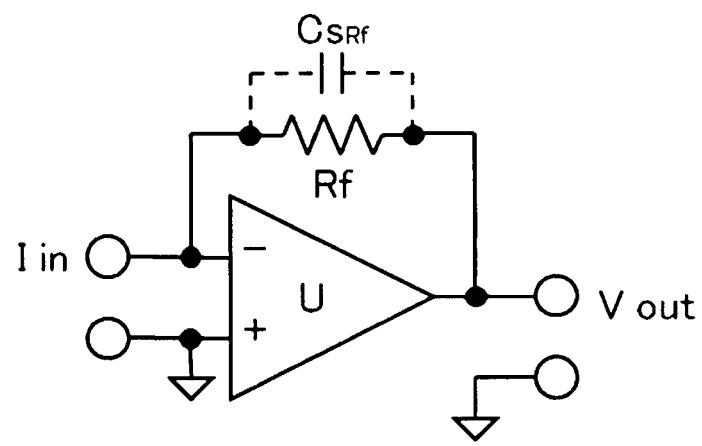
FIGS. 13A to 13E depict an amplifier circuit according to an eighth embodiment and response of this amplifier circuit.

In the related art depicted in FIG. 13A, individual feedback capacitance Cf is not used because sufficient feedback capacitance can be obtained only from the terminal capacitance $Cs_{Rf}$ (about 0.09 pF) of the feedback resistance Rf that is by chip resistance of 1 GΩ.

Figure 13B:
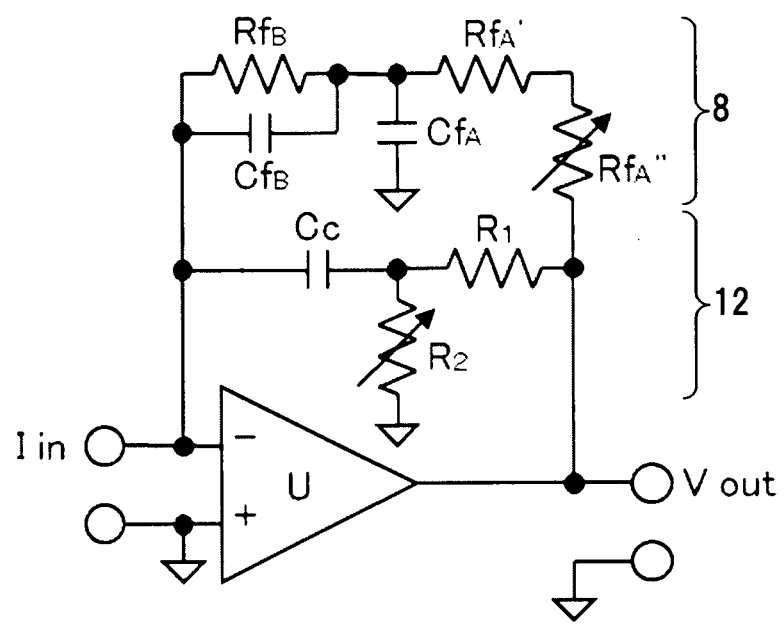

FIG. 13B depicts the application of the sixth and seventh embodiments. Resistance of 1 GΩ, whose terminal capacitance is equivalently zero, is realized by adjusting $Rf_A"$ that is variable resistance according to the sixth embodiment. Moreover, the waveform of pulse response is optimized by adjusting R2 that is variable resistance according to the seventh embodiment.

The op-amp U used in each of FIGS. 13A and 13B is the same type.

Figure 13C:
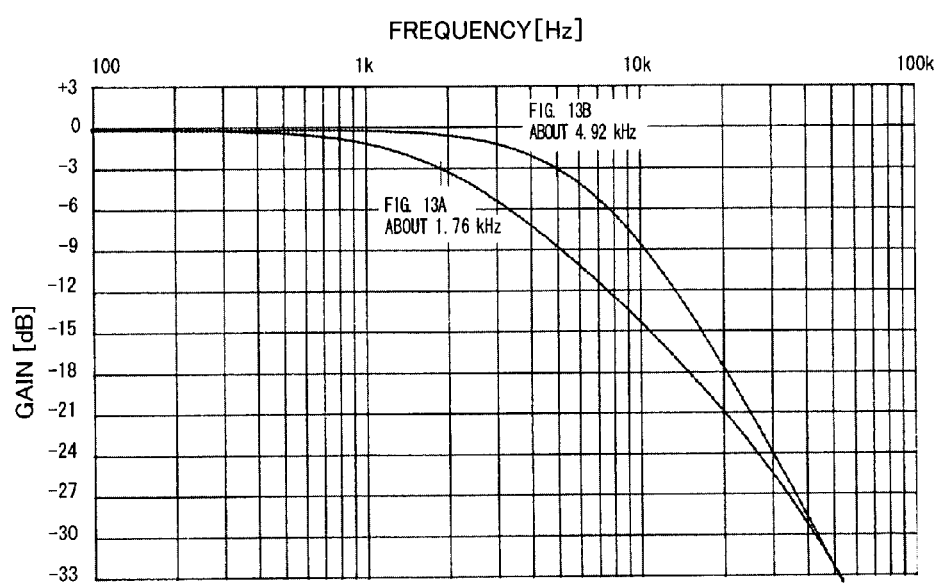

FIG. 13C depicts the frequency response of FIGS. 13A and 13B. It is found that the bandwidth fc represented by the line of FIG. 13A in FIG. 13C is about 1.76 kHz. If back-calculated using the above described formula (4), the terminal capacitance $Cs_{Rf}$ of the chip resistance of 1 GΩ, which is used as the feedback resistance Rf in FIG. 13A, is about 0.09 pF. This is consistent with a value which can be read from the response of the chip resistance of 1 GΩ depicted in FIG. 11A.

On the contrary, the bandwidth fc represented by the line of FIG. 13B in FIG. 13C is about 4.92 kHz. This is about 3 times wider than FIG. 13A, and expresses the effectiveness of the feedback circuits according to the sixth and seventh embodiments.

Figure 13D:
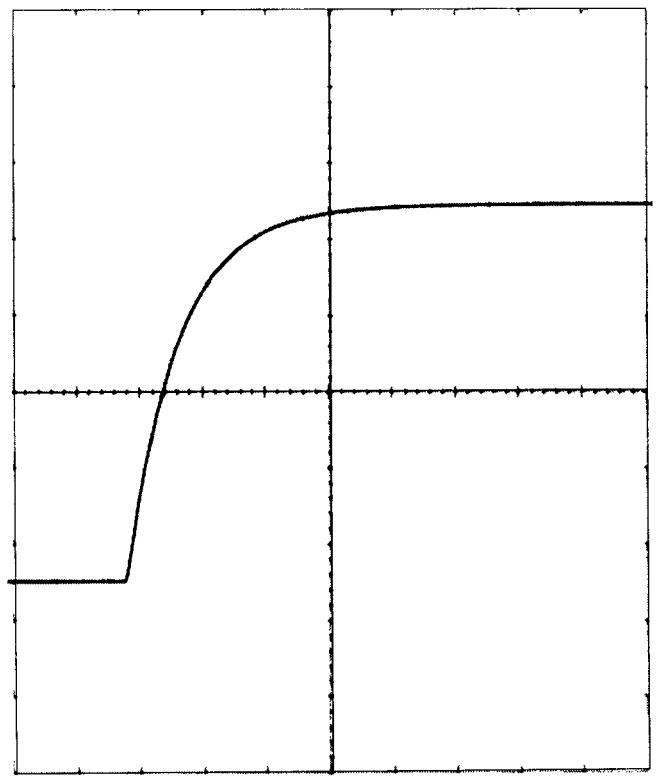
Figure 13E:
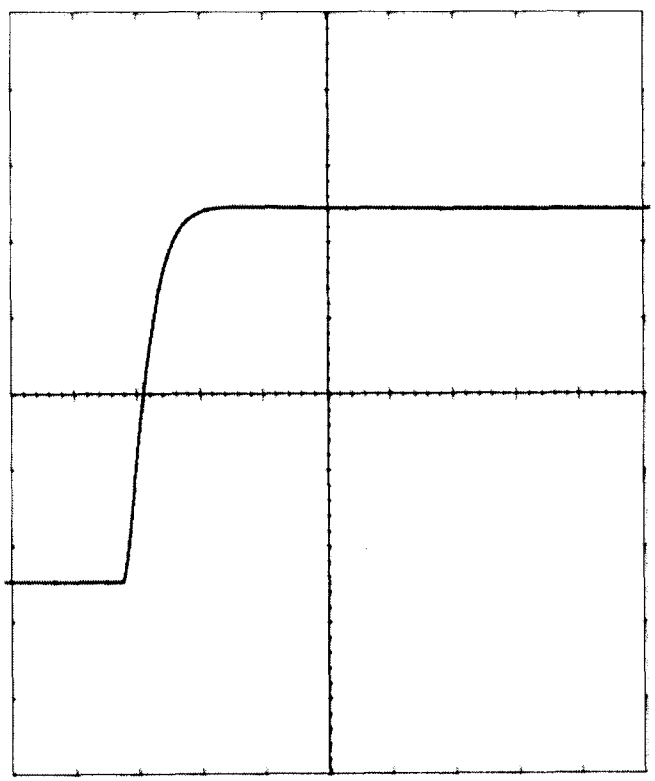

FIGS. 13D and 13E depict the waveforms of pulse response of FIGS. 13A and 13B, respectively. Both do not have an overshoot, and are good response waveforms. It is found that the rise times of both clearly differ though.

Ninth Embodiment

A ninth embodiment describes an example of applying the other embodiments to a current amplifier, a voltage amplifier, a charge amplifier, and a transimpedance amplifier for a photodiode.

Figure 14A:
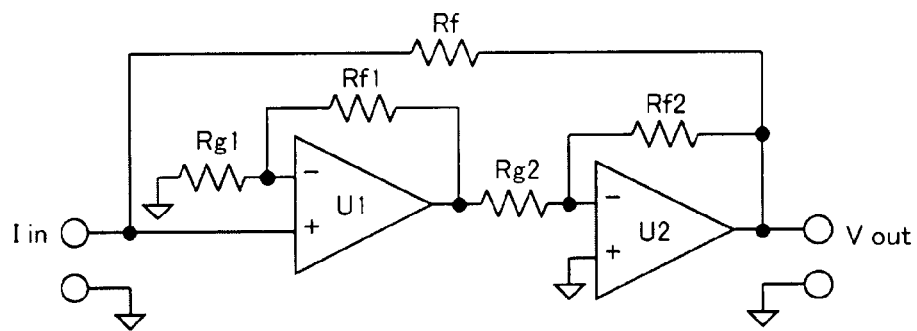
FIGS. 14A to 14D depict applications of the amplifier circuit according to a ninth embodiment.

FIG. 14A illustrates a current amplifier that has the same configuration to FIG. 1A according to the first embodiment.

Figure 14B:
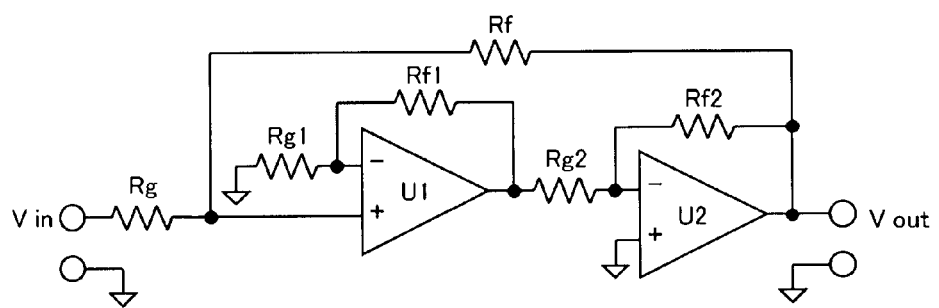

FIG. 14B illustrates a voltage amplifier that is configured by adding the gain resistance Rg to the configuration of FIG. 14A.

Figure 14C:
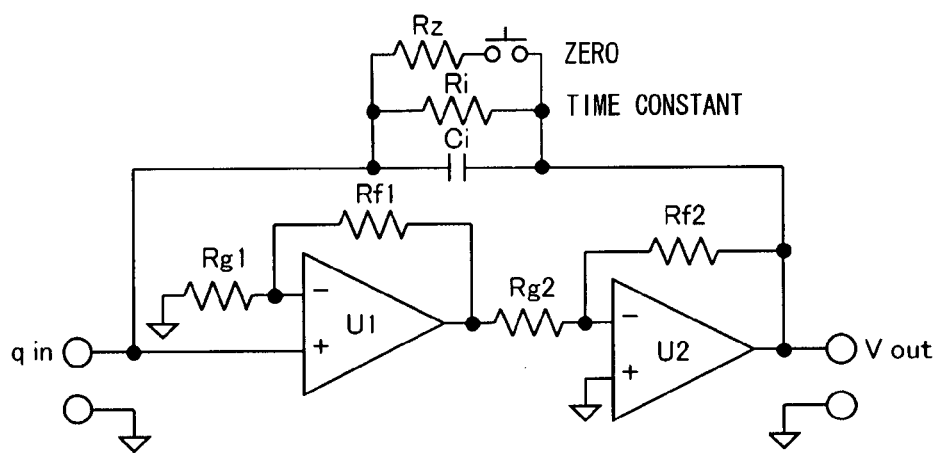

FIG. 14C illustrates a charge amplifier that is configured by replacing the feedback resistance Rf in FIG. 14A with capacitance Ci and the resistance Ri, and adding a zero-reset switch and discharge resistance Rz. The configuration of connecting two or more amplifiers, each of which negative feedback is provided to, in series, is easy to generate oscillation according to the value of the capacitance Ci. Thus, there needs some contrivance such as phase compensation and gain distribution of two or more amplifiers connected in series. There occurs no such a problem in the configuration according to the third embodiment.

Figure 14D:
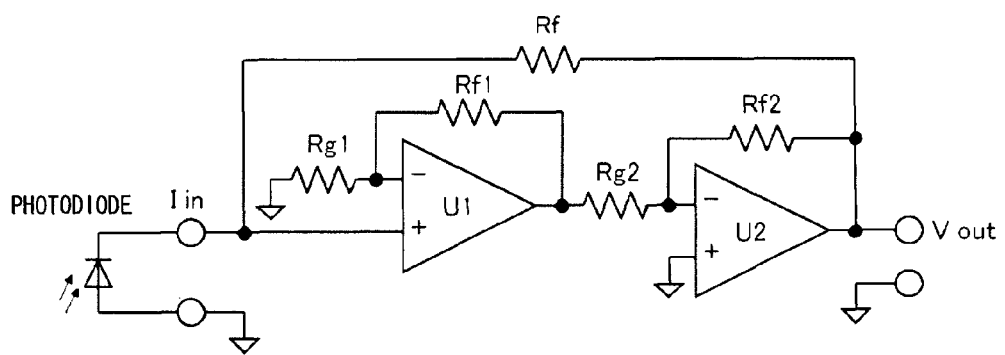

FIG. 14D depicts an example of connecting a photodiode to the input of the configuration of FIG. 14A, to use the configuration as a transimpedance amplifier for a photodiode. In this case, a bias circuit for a photodiode, which is not depicted, may be added to be used. The sixth and seventh embodiments are especially effective for this use.

Any configuration according to the second to fifth embodiments can be freely applied to portions where a non-inverting amplifier and an inverting amplifier are connected in series in FIGS. 14A to 14D. The feedback resistance Rf in FIGS. 14A to 14D can be also configured by applying the sixth embodiment, or by using the configuration of the seventh embodiment together.

It will be obvious to those skilled in the art that various changes may be made in the above-described embodiments of the present invention. However, the scope of the present invention should be determined by the following claims.

Industrial Applicability

The present invention solves any problem resulting from the inverting input capacitance Csin, the stray capacitance $Cs_{Rf}$ of the feedback resistance Rf or the like in a negative feedback amplifier, which an op-amp represents, can realize advantageous characteristics of the flatness of frequency response and wide bandwidth.

If the present invention is applied to a current amplifier (current-to-voltage converter), advantageous characteristics can be obtained such that it is difficult to be affected by the magnitude of the inverting input capacitance Csin, while the flatness of frequency response and wide bandwidth are realized although the current amplification factor is high (=the feedback resistance Rf is large).

The present invention is also proper to be used for current input in a transimpedance amplifier for a photodiode, a charge amplifier, etc., and is effective for improving the flatness of frequency response and widening bandwidth.

The present invention can be effectively used when used for a common amplifier such as a voltage amplifier, and in the use that has the issue of capacitance at a virtual ground point etc. as well.

REFERENCE SIGNS LIST 2 current amplifier
4 feedback circuit

The invention claimed is:

1. A feedback circuit that is used along with an amplifier, the feedback circuit comprising:
 a first resistance;
 a first capacitor;
 a buffer amplifier; and
 a parallel circuit of a second resistance and a second capacitor,
 wherein one end of the first resistance is connected to an output side of the amplifier, one end of the first capacitor and an input side of the buffer amplifier are connected to another end of the first resistance, another end of the first capacitor is grounded alternately, one end of the parallel circuit is connected to an output side of the buffer amplifier, and another end of the parallel circuit is connected to an input side of the amplifier, so that a product of a resistance value of the first resistance and a capacitance value of the first capacitor is equivalent to a product of a resistance value of the second resistance and a capacitance value of the second capacitor.

2. A feedback circuit that is used along with an amplifier, the feedback circuit comprising:
 a first resistance;
 a first capacitor; and
 a parallel circuit of a second resistance and a second capacitor,
 wherein one end of the first resistance is connected to an output side of the amplifier, one end of the first capacitor and one end of the parallel circuit are connected to another end of the first resistance, another end of the first capacitor is grounded alternately, and another end of the parallel circuit is connected to an input side of the amplifier, so that a product of a resistance value of the first resistance and a capacitance value of the first capacitor is equivalent to a product of a resistance value of the second resistance and a capacitance value of the second capacitor.

3. A feedback circuit that is used along with an amplifier, the feedback circuit comprising:
 an attenuator;
 a buffer amplifier; and
 a capacitor,
 wherein an input side of the attenuator is connected to an output side of the amplifier, an input side of the buffer amplifier is connected to an output side of the attenuator, one end of the capacitor is connected to an output side of the buffer amplifier, and another end of the capacitor is connected to an inverting input side of the amplifier, and
 the feedback circuit works equivalently as a capacitive element that has the same capacitance value to a product value of capacitance of the capacitor and an attenuation factor of the attenuator.

4. A feedback circuit that is used along with an amplifier, the feedback circuit comprising:
 an attenuator which includes a first resistance and a second resistance; and
 a capacitor,
 wherein an input side of the attenuator is connected to an output side of the amplifier, one end of the capacitor is connected to an output side of the attenuator, and another end of the capacitor is connected to an inverting input side of the amplifier, and
 the feedback circuit works equivalently as a capacitive element that has the same capacitance value to a product value of capacitance of the capacitor and an attenuation factor of the attenuator when impedance of the capacitor in desired frequency is larger than a value of parallel resistance, which is formed by the first resistance and the second resistance.

5. An amplifier circuit comprising:
 an amplifier, and
 one of a first, second, third and fourth feedback circuit, or both of the first or second feedback circuit and the third or fourth feedback circuit,
 wherein the first feedback circuit includes
  a first resistance,
  a first capacitor,
  a buffer amplifier, and
  a parallel circuit of a second resistance and a second capacitor,
  wherein one end of the first resistance is connected to an output side of the amplifier, one end of the first capacitor and an input side of the buffer amplifier are connected to another end of the first resistance, another end of the first capacitor is grounded alternately, one end of the parallel circuit is connected to an output side of the buffer amplifier, and another end of the parallel circuit is connected to an input side of the amplifier, so that a product of a resistance value of the first resistance and a capacitance value of the first capacitor is equivalent to a product of a resistance value of the second resistance and a capacitance value of the second capacitor,
 the second feedback circuit includes
  the first resistance,
  the first capacitor, and
  the parallel circuit of the second resistance and the second capacitor,
  wherein one end of the first resistance is connected to the output side of the amplifier, one end of the first capacitor and one end of the parallel circuit are connected to another end of the first resistance, another end of the first capacitor is grounded alternately, and another end of the parallel circuit is connected to the input side of the amplifier, so that the product of the resistance value of the first resistance and the capacitance value of the first capacitor is equivalent to the product of the resistance value of the second resistance and the capacitance value of the second capacitor,
 the third feedback circuit includes
  an attenuator,
  a buffer amplifier, and
  a capacitor,
  wherein an input side of the attenuator is connected to the output side of the amplifier, an input side of the buffer amplifier is connected to an output side of the attenuator, one end of the capacitor is connected to an output side of the buffer amplifier, and another end of the capacitor is connected to the inverting input side of the amplifier, and
 the feedback circuit works equivalently as a capacitive element that has the same capacitance value to a product value of capacitance of the capacitor and an attenuation factor of the attenuator, and the fourth feedback circuit includes
an attenuator which includes a third resistance and a fourth resistance, and
the capacitor,
wherein an input side of the attenuator is connected to the output side of the amplifier, one end of the capacitor is connected to an output side of the attenuator, and another end of the capacitor is connected to the inverting input side of the amplifier, and
the feedback circuit works equivalently as a capacitive element that has the same capacitance value to a product value of capacitance of the capacitor and an attenuation factor of the attenuator when impedance of the capacitor in desired frequency is larger than a value of parallel resistance, which is formed by the third resistance and the fourth resistance.

6. The amplifier circuit of claim 5, wherein the amplifier circuit configures a current amplifier, a voltage amplifier, a charge amplifier, or a transimpedance amplifier for a photodiode.

* * * * *